US007542301B1

(12) United States Patent
Liong et al.

(10) Patent No.: US 7,542,301 B1
(45) Date of Patent: Jun. 2, 2009

(54) CREATING RECESSED REGIONS IN A SUBSTRATE AND ASSEMBLIES HAVING SUCH RECESSED REGIONS

(75) Inventors: Lily Liong, San Jose, CA (US); Kenneth D. Schatz, Los Altos, CA (US); Gordon Craig, Palo Alto, CA (US); Mark A. Hadley, Newark, CA (US); Eric Kanemoto, San Jose, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 432 days.

(21) Appl. No.: 11/159,574

(22) Filed: Jun. 22, 2005

(51) Int. Cl.
*H05K 1/18* (2006.01)
(52) U.S. Cl. .................. 361/761; 361/737
(58) Field of Classification Search ............ 257/679, 257/703, 732, E23.064, E23.065, E23.125, 257/E23.176, E23.177, 622; 361/737
See application file for complete search history.

(56) References Cited

U.S. PATENT DOCUMENTS

| | | | |
|---|---|---|---|
| 4,670,770 A | 6/1987 | Tai | |
| 4,818,855 A | 4/1989 | Mongeon et al. | |
| 4,857,893 A | 8/1989 | Carroll | |
| 4,937,653 A | 6/1990 | Blonder et al. | |
| 4,990,462 A | 2/1991 | Sliwa, Jr. et al. | |
| 5,008,213 A | 4/1991 | Kolesar et al. | |
| 5,032,896 A | 7/1991 | Little et al. | |
| 5,048,179 A | 9/1991 | Shindo et al. | |
| 5,083,697 A | 1/1992 | Difrancesco | |
| 5,099,227 A | 3/1992 | Geiszler et al. | |
| 5,138,436 A | 8/1992 | Koepf et al. | |
| 5,188,984 A | 2/1993 | Nishiguchi | |

(Continued)

FOREIGN PATENT DOCUMENTS

DE     199 29 610 C1     10/2000

(Continued)

OTHER PUBLICATIONS

PCT International Written Opinion, PCT Application No. PCT/US03/02115 (4 pages).

(Continued)

*Primary Examiner*—Evan Pert
*Assistant Examiner*—Selim Ahmed
(74) *Attorney, Agent, or Firm*—Blakely, Sokoloff, Taylor & Zafman LLP

(57) ABSTRACT

An embossing die, the die comprises one or more protruding features configured to create one or more corresponding recessed regions in a substrate; and a left side edge and a right side edge. Either the left side edge or the right side edge is a gradually sloping edge. The embossing die can be used to form an assembly. The assembly comprises a substrate including a more than one defined frames. Each of the defined frames comprises a plurality of recessed regions and a plurality of functional blocks, each functional block being deposited in one of the recessed regions. Each of the defined frames is separated from another frame by a region. The region can be a flattened region, a sloped region, or a plateau shaped region having a plateau top and two sloped sides, wherein each sloped side forms about 10-15 degree angle to a surface of the substrate.

16 Claims, 22 Drawing Sheets

U.S. PATENT DOCUMENTS

| | | | |
|---|---|---|---|
| 5,205,032 A | 4/1993 | Kuroda et al. | |
| 5,212,625 A | 5/1993 | van Andel et al. | |
| 5,221,831 A | 6/1993 | Geiszler | |
| D343,261 S | 1/1994 | Eberhardt | |
| 5,298,685 A | 3/1994 | Bindra et al. | |
| 5,353,498 A | 10/1994 | Fillion et al. | |
| D353,343 S | 12/1994 | Eberhardt | |
| 5,378,880 A | 1/1995 | Eberhardt | |
| 5,382,784 A | 1/1995 | Eberhardt | |
| 5,382,952 A | 1/1995 | Miller | |
| 5,420,757 A | 5/1995 | Eberhardt et al. | |
| 5,422,513 A | 6/1995 | Marcinkiewicz et al. | |
| 5,430,441 A | 7/1995 | Bickley et al. | |
| 5,435,057 A | 7/1995 | Bindra et al. | |
| 5,444,223 A | 8/1995 | Blama | |
| RE35,119 E | 12/1995 | Blonder | |
| 5,514,613 A | 5/1996 | Santadrea et al. | |
| 5,517,752 A | 5/1996 | Sakata et al. | |
| 5,528,222 A | 6/1996 | Moskowitz et al. | |
| 5,545,291 A | 8/1996 | Smith et al. | |
| 5,556,441 A | 9/1996 | Courtwright | |
| 5,557,470 A | 9/1996 | Shibayama | |
| 5,565,846 A | 10/1996 | Geiszler et al. | |
| 5,574,470 A | 11/1996 | de Vall | |
| D378,578 S | 3/1997 | Eberhardt | |
| 5,707,902 A | 1/1998 | Chang et al. | |
| 5,708,419 A | 1/1998 | Isaacson et al. | |
| 5,715,594 A | 2/1998 | Patterson et al. | |
| 5,745,984 A | 5/1998 | Cole, Jr. et al. | |
| 5,754,110 A | 5/1998 | Appalucci et al. | |
| 5,779,839 A | 7/1998 | Tuttle et al. | |
| 5,783,856 A | 7/1998 | Smith et al. | |
| 5,798,050 A | 8/1998 | Gaynes et al. | |
| 5,818,348 A | 10/1998 | Walczak et al. | |
| 5,824,186 A | 10/1998 | Smith et al. | |
| 5,904,545 A | 5/1999 | Smith et al. | |
| 5,910,770 A | 6/1999 | Ohara | |
| 5,914,862 A | 6/1999 | Ferguson et al. | |
| 5,995,006 A | 11/1999 | Walsh | |
| 6,018,299 A | 1/2000 | Eberhardt | |
| 6,019,284 A | 2/2000 | Freeman et al. | |
| 6,031,450 A | 2/2000 | Huang | |
| 6,040,773 A | 3/2000 | Vega et al. | |
| 6,064,116 A | 5/2000 | Akram | |
| 6,078,791 A | 6/2000 | Tuttle et al. | |
| 6,091,332 A | 7/2000 | Eberhardt et al. | |
| 6,094,138 A | 7/2000 | Eberhardt et al. | |
| 6,094,173 A | 7/2000 | Nylander | |
| 6,100,804 A | 8/2000 | Brady et al. | |
| 6,107,920 A | 8/2000 | Eberhardt et al. | |
| 6,122,492 A | 9/2000 | Sears | |
| 6,133,833 A | 10/2000 | Sidlauskas et al. | |
| 6,133,835 A | 10/2000 | De Leeuw et al. | |
| 6,134,130 A | 10/2000 | Connell et al. | |
| 6,147,605 A | 11/2000 | Vega et al. | |
| 6,147,662 A | 11/2000 | Grabau et al. | |
| 6,164,551 A | 12/2000 | Altwasser | |
| 6,181,287 B1 | 1/2001 | Beigel | |
| 6,189,208 B1 | 2/2001 | Estes et al. | |
| 6,194,119 B1 | 2/2001 | Wolk et al. | |
| 6,195,858 B1 | 3/2001 | Ferguson et al. | |
| 6,204,163 B1 | 3/2001 | Panchou et al. | |
| 6,206,282 B1 | 3/2001 | Hayes, Sr. et al. | |
| 6,219,911 B1 | 4/2001 | Estes et al. | |
| 6,222,212 B1 | 4/2001 | Lee et al. | |
| 6,229,203 B1 | 5/2001 | Wojnarowski et al. | |
| 6,229,442 B1 | 5/2001 | Rolin et al. | |
| 6,236,316 B1 | 5/2001 | Eberhardt et al. | |
| 6,246,327 B1 | 6/2001 | Eberhardt | |
| 6,252,508 B1 | 6/2001 | Vega et al. | |
| 6,262,692 B1 | 7/2001 | Babb | |
| 6,265,977 B1 | 7/2001 | Vega et al. | |
| 6,268,796 B1 | 7/2001 | Gnadinger et al. | |
| 6,274,391 B1 | 8/2001 | Wachtler et al. | |
| 6,274,508 B1 | 8/2001 | Jacobsen et al. | |
| 6,275,156 B1 | 8/2001 | Rasband | |
| 6,275,681 B1 | 8/2001 | Vega et al. | |
| 6,281,038 B1 | 8/2001 | Jacobsen et al. | |
| 6,282,407 B1 | 8/2001 | Vega et al. | |
| 6,291,896 B1 | 9/2001 | Smith | |
| 6,297,072 B1 | 10/2001 | Tilmans et al. | |
| 6,309,912 B1 | 10/2001 | Chiou et al. | |
| 6,313,747 B2 | 11/2001 | Imaichi et al. | |
| 6,320,543 B1 | 11/2001 | Ohata et al. | |
| 6,320,753 B1 | 11/2001 | Launay | |
| 6,329,917 B1 | 12/2001 | Leonard | |
| 6,357,005 B1 | 3/2002 | Devaux et al. | |
| 6,366,468 B1 | 4/2002 | Pan | |
| 6,384,425 B1 | 5/2002 | Huber et al. | |
| 6,392,213 B1 | 5/2002 | Martorana et al. | |
| 6,410,415 B1 | 6/2002 | Estes et al. | |
| 6,417,025 B1 | 7/2002 | Gengel et al. | |
| 6,420,266 B1 | 7/2002 | Smith et al. | |
| 6,448,109 B1 | 9/2002 | Karpman | |
| 6,528,351 B1 | 3/2003 | Nathan et al. | |
| 6,530,649 B1 | 3/2003 | Pan | |
| 6,536,674 B2 | 3/2003 | Kayanakis et al. | |
| 6,542,444 B1 | 4/2003 | Rutscher | |
| 6,559,666 B2 | 5/2003 | Bernier et al. | |
| 6,586,323 B1 * | 7/2003 | Fan et al. | 438/614 |
| 6,590,346 B1 | 7/2003 | Hadley et al. | |
| 6,606,247 B2 * | 8/2003 | Credelle et al. | 361/737 |
| 6,611,237 B2 | 8/2003 | Smith | |
| 6,653,157 B2 | 11/2003 | Kondo | |
| 6,665,044 B1 | 12/2003 | Jacobsen et al. | |
| 6,677,186 B1 | 1/2004 | Zafrany et al. | |
| 6,696,785 B2 | 2/2004 | Shimoda et al. | |
| 6,727,970 B2 | 4/2004 | Grace et al. | |
| 6,779,733 B2 | 8/2004 | Akita et al. | |
| 6,780,696 B1 | 8/2004 | Schatz | |
| 6,794,221 B2 | 9/2004 | Sayyah | |
| 6,816,380 B2 | 11/2004 | Credelle et al. | |
| 6,841,419 B2 | 1/2005 | Akita et al. | |
| 6,844,673 B1 * | 1/2005 | Bernkopf | 313/506 |
| 6,853,087 B2 | 2/2005 | Neuhaus et al. | |
| 6,856,086 B2 | 2/2005 | Grace et al. | |
| 6,863,219 B1 | 3/2005 | Jacobsen et al. | |
| 6,864,570 B2 * | 3/2005 | Smith | 257/703 |
| 6,867,983 B2 | 3/2005 | Liu et al. | |
| 6,908,295 B2 | 6/2005 | Thielman et al. | |
| 6,919,680 B2 | 7/2005 | Shimoda et al. | |
| 6,957,481 B1 | 10/2005 | Patrice | |
| 2001/0000631 A1 | 5/2001 | Zandman et al. | |
| 2001/0031514 A1 * | 10/2001 | Smith | 438/107 |
| 2001/0035759 A1 | 11/2001 | Bernier et al. | |
| 2001/0055835 A1 | 12/2001 | Pendse | |
| 2002/0001046 A1 * | 1/2002 | Jacobsen et al. | 349/42 |
| 2002/0018357 A1 | 2/2002 | Oguchi et al. | |
| 2002/0041234 A1 | 4/2002 | Kuzma et al. | |
| 2002/0061392 A1 | 5/2002 | Jacobsen et al. | |
| 2002/0093396 A1 | 7/2002 | Smith | |
| 2002/0114587 A1 | 8/2002 | Golwaker et al. | |
| 2002/0127864 A1 | 9/2002 | Smith et al. | |
| 2002/0149107 A1 | 10/2002 | Chang et al. | |
| 2003/0029921 A1 | 2/2003 | Akita et al. | |
| 2003/0034400 A1 | 2/2003 | Han et al. | |
| 2003/0054881 A1 | 3/2003 | Hedrick et al. | |
| 2003/0136503 A1 | 7/2003 | Green | |
| 2003/0148555 A1 | 8/2003 | Akita et al. | |
| 2003/0232174 A1 * | 12/2003 | Chang et al. | 428/156 |
| 2004/0037053 A1 | 2/2004 | Akita et al. | |
| 2004/0052202 A1 | 3/2004 | Brollier | |
| 2004/0052203 A1 | 3/2004 | Brollier | |

| | | | | |
|---|---|---|---|---|
| 2006/0204675 A1 * | 9/2006 | Gao et al. ............... 428/1.1 | WO | WO 02/097724 A1 12/2002 |
| | | | WO | WO 03/063211 7/2003 |
| | FOREIGN PATENT DOCUMENTS | | WO | WO 2004/097731 A2 11/2004 |

| | | |
|---|---|---|
| EP | 0 992 939 A1 | 4/2000 |
| EP | 1 014 302 A1 | 6/2000 |
| JP | 11353439 A | 12/1999 |
| JP | 2001175837 A | 6/2001 |
| WO | WO 99/41701 A2 | 8/1999 |
| WO | WO 00/52109 | 9/2000 |
| WO | WO 01/33621 A2 | 5/2001 |
| WO | WO 01/75789 | 10/2001 |

OTHER PUBLICATIONS

PCT International Search Report for PCT Application No. PCT/US2005/002534. Mailed on Nov. 11, 2005, (7 pages).

PCT Written Opinion Report for PCT Application No. PCT/US2005/002534. Mailed on Nov. 11, 2005, (7 pages).

* cited by examiner

CREATING RECESSED REGIONS IN A SUBSTRATE AND ASSEMBLIES HAVING SUCH RECESSED REGIONS

RELATED APPLICATIONS

This application is related to co-pending U.S. patent application Ser. Nos. 11/159,526 and 11/159,550 filed on the same day with this application, Jun. 22, 2005, and which are hereby incorporated by reference in their entireties.

FIELD

The present invention relates generally to the field of fabricating electronic devices with small functional elements depositing in a substrates. More specifically, embodiments of the present invention relate to fabricating a plurality of assemblies on a frame or frames of substrate. Embodiments of the present invention also relate to a tool to form the recessed regions for the functional elements to be deposited therein.

BACKGROUND

There are many examples of functional blocks or components that can provide, produce, or detect electromagnetic or electronic signals or other characteristics. The functional blocks are typically objects, microstructures, or microelements with integrated circuits built therein or thereon. An example of using the functional components is using them as an array of a display drivers in a display where many pixels or sub-pixels are formed with an array of electronic elements. For example, an active matrix liquid crystal display includes an array of many pixels or sub-pixels which are fabricated using amorphous silicon or polysilicon circuit elements. Additionally, a billboard display or a signage display such as store displays and airport signs are also among the many electronic devices employing these functional components.

Functional components have also been used to make other electronic devices. One example of such use is that of a radio frequency (RF) identification tag (RFID tag) which contains a functional block or several blocks each having a necessary circuit element. Information is recorded into these blocks, which is then transferred to a base station. Typically, this is accomplished as the RFID tag, in response to a coded RF signal received from the base station, functions to cause the RFID tag to reflect the incident RF carrier back to the base station thereby transferring the information.

The functional components may also be incorporated into substrates to make displays such as flat panel displays, liquid crystal displays (LCDs), active matrix LCDs, and passive matrix LCDs. Making LCDs has become increasingly difficult because it is challenging to produce LCDs with high yields. Furthermore, the packaging of driver circuits has become increasingly difficult as the resolution of the LCD increases. The packaged driver elements are also relatively large and occupy valuable space in a product, which results in larger and heavier products.

Demand for functional components has expanded dramatically. Clearly, the functional components have been applied to make many electronic devices, for instance, the making of microprocessors, memories, power transistors, super capacitors, displays, x-ray detector panels, solar cell arrays, memory arrays, long wavelength detector array, phased arrays antennas, RFID tags, chemical sensors, electromagnetic radiation sensors, thermal sensors, pressure sensors, or the like. The growth for the use of functional components, however, has been inhibited by the high cost of assembling the functional components into other substrates.

Often the assembling of these components requires complex and multiple processes thereby causing the price of the end product to be expensive. Further, the manufacturing of these components is costly because of inefficient and wasteful uses of the technologies and the materials used to make these products under the current method.

Many aspects such as substrates' materials, characteristics, and dimensions, and/or functional blocks' dimensions and characteristics, recessed regions' dimensions and features, and the like, impact the efficiency of assembling the functional components into substrates. Accurate dimension and parameter control of these aspects are crucial for assembling efficiency and reducing assembling cost for electronic devices containing functional blocks deposited therein.

SUMMARY

The present invention provides methods and apparatuses for forming electronic assemblies that includes functional elements. More specifically, embodiments of the present invention relate to fabricating a plurality of assemblies in a frame or frames of substrate. A frame of substrate can be referred to as an area of the substrate. The area can be of any predetermined dimension. A controlled region is provided between frames to separate or identify one frame to the next. The assemblies can later be singulated into individual assemblies. Embodiments of the present invention also relate to a tool to form the recessed regions for the functional elements to be deposited therein. The tool is configured to form a controlled gradual ramp between one frame to the next frame.

One embodiment pertains to an embossing die. The embossing die comprises one or more protruding features, a left side edge and a right side edge. The protruding features are configured to create one or more corresponding recessed regions in a substrate. Either the left side edge or the right side edge is a gradually sloping edge. The remaining side edge can be a gradually sloping edge, a contour edge, or a straight edge.

In one embodiment, the embossing die is used to form an assembly. The assembly comprises a substrate including more than one defined frames. The embossing die forms recessed regions in one frame of the substrate. In one embodiment, the embossing die forms recessed regions in all the frames of the substrate using a step-and-repeat process. Each of the defined frames comprises a plurality of recessed regions and a plurality of functional blocks, each functional block being deposited in one of the recessed regions. Each of the defined frames is separated from another frame by a region. The region can be a flattened region, a sloped region, or a plateau shaped region having a plateau top and two sloped sides, wherein each sloped side forms about 10-15 degree angle to a surface of the substrate. The region's configuration depends on configuration of the gradually sloping edge and the alignment of the frames with respect to the embossing die.

One embodiment pertains to a method, which comprises providing a web substrate and passing the web substrate under or over an embossing die. The embossing die is configured to move up or down with respect to the substrate to create recessed regions in an area of the web substrate. The embossing die comprises protruding features configured to create the recessed regions. The embossing die also comprises a left side edge and a right side edge in which, at least one of the left side edge and the right side edge is a gradually sloping edge. The method further includes forming the recessed regions into a first area of the web substrate, advancing the web substrate so that a second area of the web substrate can be formed with the recessed regions, and forming the recessed regions into the second area. The method further includes aligning the embossing die over the web substrate such that between the first area and the second area, a region is formed wherein the region has a controlled configuration. The controlled configuration can be a gradually slope plateau configuration having a flattened top side and two sloped sides, each of the two sloped sides forming a 10-15 degree angle to a surface of the substrate; a flattened region; or a sloped region with a maximum vertical height of less than 100 µm.

One embodiment pertains to a method, which comprises providing a plurality of substrates. The substrates includes at least differently treated substrates, different substrates, substrates made of different materials, substrates comprises of different materials, and substrates intended to used for different types of devices. Further, the method includes forming recessed regions in each of the substrates. The recessed regions on one of the substrates need not (but can be) similar or exactly like recessed regions on another one of the substrate. An embossing die is used to form the recessed regions in at least one of the plurality of substrates. The embossing die comprises protruding features configured to create the recessed regions, a left side edge, and a right side edge. At least one of the left side edge or the right side edge is a gradually sloping edge. Further, the method includes joining the plurality of substrates together to form a roll of substrate and performing one or more Fluidic-Self Assembly processes on the roll of substrate to deposit a plurality of functional blocks into the recessed regions. The plurality of functional blocks may be of same types or different types of functional blocks. An example of Fluidic Self-Assembly (FSA) is described in U.S. Pat. No. 6,864,570, entitled "Method for fabricating self-assembling microstructures," which is incorporated by reference herein.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

Figure 1:
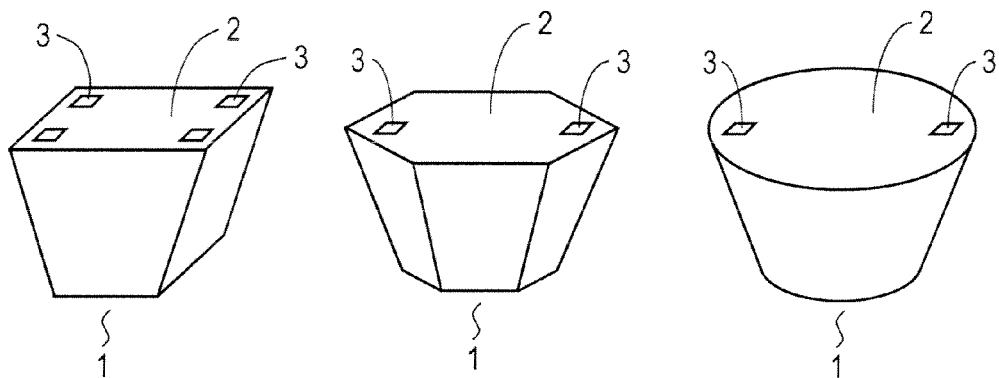
FIG. 1 illustrates an example of a functional component block.

In the following description, for purposes of explanation, numerous specific details are set forth in order to provide a thorough understanding of the invention. It will be apparent to one skilled in the art, however, that the invention can be practiced without these specific details. In other instances, structures and devices are shown in block diagram form to avoid obscuring the invention.

Embodiments of the present invention relate to methods for forming holes, openings, or recessed regions in a substrate or web substrate and depositing functional blocks into the recessed regions, forming layers, and/or electrical interconnections to the blocks to form electronic assemblies. On many occasions, the disclosure refers to the substrate with one or more functional blocks deposited therein as a "strap assembly." Electronic devices that can be formed using embodiments include a display, a smart card, a sensor, an electronic tag, an RFID tag, etc. Some embodiments of the present invention also relate to devices and methods that are used to form recessed regions in the substrate for functional blocks to be deposited therein. Some embodiments of the present invention also relate to feature dimensions and specifics of the functional blocks with respect the substrate and the recessed regions. The following description and drawings are illustrative of the invention and are not to be construed as limiting the invention.

Embodiments of the invention apply to both flexible and rigid substrates, as well to both monolayer and multilayer substrates. By creating recessed regions in a substrate, the substrate is able to receive a functional block or functional blocks that may have a circuit element thereon. In some embodiments, the substrate includes one functional block. In many embodiments, the substrate includes a plurality of such recessed regions for a plurality of such functional blocks. Typically the blocks are contained in a slurry, which is deposited onto the flexible substrate as is typically done in a Fluidic Self-Assembly (FSA) process. Although the blocks may be comprised of single crystal silicon or other like material, which makes the block rigid, the substrate may still be flexible because the size of these blocks (e.g., 650×500 microns or 850×850 microns) is small or significantly small in comparison to the flexible substrate (e.g., 3×6 mm or even larger). In some embodiments, the flexible substrate forms part of an RFID tag, a merchandise label, a pharmaceutical label/seal, or a display backplane, to name a few example applications.

Many devices are made from a combination of a strap substrate and another substrate (or a receiving substrate or a device substrate). Such devices may include an RFID tags, a display, a smart card, a sensor, an electronic tag, or a sensor device. A device with a strap substrate combined to another substrate are described in U.S. Pat. No. 6,606,247, which is hereby incorporated herein by reference. In one example of this combination, the strap substrate is fabricated with one or more recessed receptor sites, and one or more functional or integrated circuit blocks are deposited into the recessed receptor sites, for example, using a Fluidic Self-Assembly (FSA) process. The functional blocks may be deposited by one or more FSA operations, by robotic pick-and-place operations, or by other methods. After a functional block is deposited into the corresponding strap substrate, the strap substrate is then attached to another substrate, which may comprise a set of patterned or printed conductor. The conductor can be an electrical element of a device, for instance, the conductor can be elements or parts of an antenna for an RFID device. More than one functional block may be deposited into a strap substrate depending on application.

A strap assembly is formed when one or more functional blocks are deposited in the strap substrate and other elements (e.g., dielectric layer and electrical interconnection) formed thereon. The overall manufacturing process of a strap assembly impacts the cost of the final device that incorporates the strap assembly. For example, when a strap assembly is formed using a web process, efficiencies of the block deposition, dielectric film formation, material usage, or electrical interconnection fabrication play important roles in the final device cost and performance.

FIG. 1 illustrates exemplary embodiments of an object that is functional component block 1. The functional block 1 can have various shapes and sizes. Each functional block 1 has a top surface 2 upon which a circuit element is situated (not shown). The circuit element on the top surface 2 may be an ordinary integrated circuit (IC) configured for any particular function. For example, the IC may be configured to drive a pixel of a display. The IC may also be configured to receive power from another circuit, such as an antenna, and perform a particular function or functions for the operation of a passive RFID tag. Alternatively, the IC may be configured to receive power from an energy source (e.g. battery) for the operation of an active RFID tag. The functional block 1 also includes a contact pad 3 (one or more contact pads 3) to allow electrical interconnection to the circuit element on the block 1. The functional block 1 can have a trapezoidal, rectangular, square, cylinder, asymmetrical, or symmetrical shape. The top of the block 1 is often (but need not be) wider than the bottom of the block 1. Each functional block 1 may be created from a host substrate and separated from the host substrate. Methods of making a functional block 1 are known in the art and for instance, can be found U.S. Pat. Nos. 5,783,856; 5,824,186; 5,904,545; 5,545,291; and 6,291,896, which are hereby incorporated by reference in their entireties.

Figure 2A:
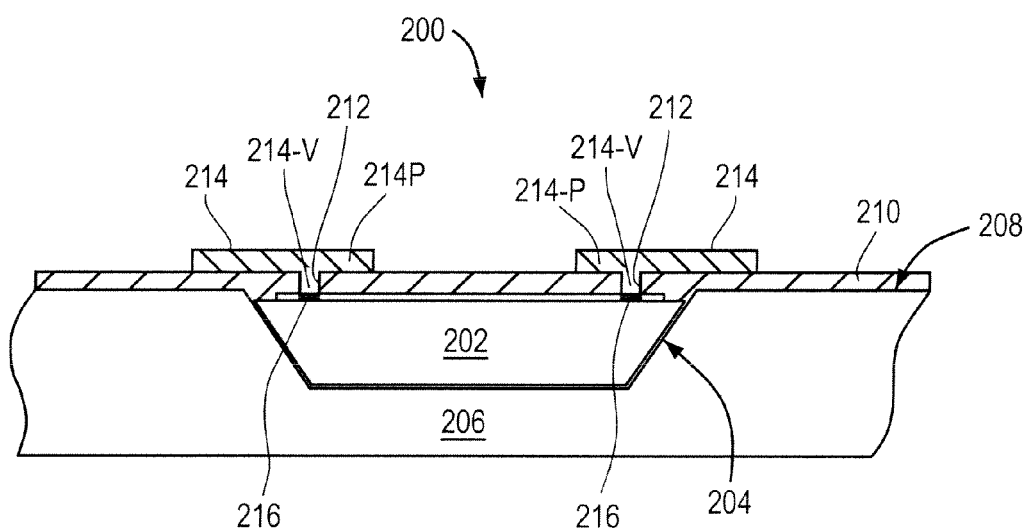
FIG. 2A illustrates an exemplary embodiment of an electronic assembly with the functional block deposited therein.

FIG. 2A illustrates a cross-sectional view of an exemplary embodiment of an electronic assembly (or a strap assembly) 200. The assembly 200 can be part of or made to incorporate into a display device, a RFID tag, a merchandise label (a CD label), a pharmaceutical label or bottle, etc. The assembly 200 can be attached to another substrate (e.g., a device substrate) that may have patterned, printed, or formed thereon a conductor or conductors. A functional block 202 is deposited in recessed region 204 of a substrate 206 to form the assembly 200. The functional block 202 can be the functional block 1 previously discussed. Methods of making a functional block are known in the art. In one embodiment, the functional block 202 is a NanoBlock™ made by Alien Technology. Methods of making the recessed region 204 according to embodiments of the present invention will be discussed below. Once deposited, the functional block 202 is recessed below a surface 208 of the substrate 206. In one embodiment, the functional block 202 is recessed sufficiently below the surface 208 to provide sufficient space for electrical connection to the functional block 202. In one embodiment, the functional block 202 is deposited into the recessed region 204 using a Fluidic Self-Assembly (FSA) process. The surface 208 of the substrate 206 is the native surface of the substrate 206 before any deposition of any other materials on top of the surface 208. The substrate 206 may be a flexible substrate made out of plastic, fabric, metal, or some other suitable materials. In one embodiment, the substrate 206 is flexible. In one embodiment, the substrate 206 is flexible. In one embodiment, the assembly 200 is flexible.

Figure 2B:
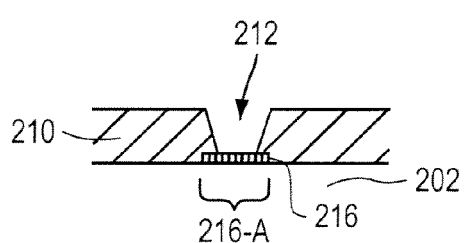
FIGS. 2B-2C illustrate exemplary embodiments of a via formed in a dielectric layer.
Figure 2C:
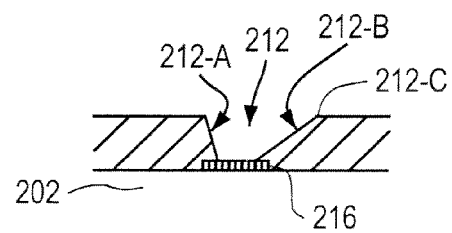

Also shown in FIG. 2A, a dielectric layer 210 is formed over the surface 208 and over the functional block 202. The dielectric layer 210 in many instances, also functions as a planarization layer as well as a layer that traps or keeps the functional block 202 in the recessed region 204. Vias 212 are also formed into the dielectric layer 210 to expose portions of the functional block 202. Typically, each of the exposed portions of the functional block 202 comprises a contact pad 216 that enables electrical interconnection to the functional block 202. In one embodiment, the functional block 202 includes two contact pads 216 placed on opposite sides and/or diagonal to each other. In such embodiments, the dielectric layer 210 has two vias 212, one for each contact pad 216. Each via 212 exposes some or all of the top area 216-A of the corresponding contact pad 216 (FIGS. 2B-2C). In one embodiment, as shown in FIG. 2B each via 212 has a diameter that is smaller than the top area 216-A of the corresponding contact pad 216. In some embodiment, the via 212 has a cone-like shape where the via 212 has a top diameter and a bottom diameter. The bottom diameter is smaller than the top diameter. Additionally, the bottom diameter is at least 20% smaller than the contact pad 216. Optimally, the diameter of the via 212 at the bottom should be no more than 80% of the width of the contact pad 216, which may be defined by the area 216-A. Most optimally, it should be no more than 60% of the width of the contact pad 216, which may be defined by the area 216-A. In one embodiment, the via 212 has a non-symmetrical cone-like shape in which one side of the via 212 has a flatter or gentler slope than the other side (FIG. 2C). As shown in FIG. 2C, the via 212 has two sides, 212-A and 212-B, in which the side 212-B has a more "gentle" or flatter slope than the side 212-A. In one embodiment, a small protrusion 212-C is formed on the side 212-B of the via 212. The configuration of the via 212 in accordance to the present embodiment helps the conductive material to more easily fill the via 212.

In one embodiment, the dielectric film 210 is deposited using a roll-to-roll process over the substrate 206 that has the functional block 202 deposited therein. The dielectric film 210 may be deposited using methods such as lamination of a polymer film or coating of a liquid layer over the substrate 206 and subsequent curing to form the dielectric film 210. In one embodiment, the dielectric film 210 is deposited by a wet coating process, such as comma coating, or by a direct writing process, and subsequently dried or cured. The dielectric film 210 may be necessary in embodiments where the assembly 200 is used for devices such as RFID tag since the dielectric film 210 provides good RF performance for the RFID tag. The dielectric film 210 contains at least one opening formed through the dielectric film for the via 212. Each via 212 enables the conductive interconnect 214 formed on the top of and into the dielectric film 210 to make electrical connection with a contact pad 216 on the functional block 202.

Each conductive interconnect 214 can be one conductor or two conductors joined together. The conductive interconnect 214 can be formed in a one-step process or a two-step process. When the conductive interconnect 21 is made of two (2) conductors, one conductor is referred to as a "via conductor" (214-V) since it fills the via 212. The other conductor is referred to a "pad conductor" (214-P) which sits on a portion of the dielectric layer 210 and connects or joins the via conductor 214-V.

Each via 212 in the dielectric film 210 is positioned over a contact pad 216, such that the via 212 enables interconnection from the contact pad 216 on the functional block 202 to the interconnect 214. In one embodiment, each via 212 is formed such that no dielectric material is present in the via 212.

In many embodiments, there are two (2) (or more) vias 212 created over each functional block 202. The number of vias 212 can be increased or decreased depending on the product. The number of vias 212 also depends on how many contact pads 216 are present in the functional block 202 or depending on how many electrical connection is needed. For example, many more dielectric vias may be needed for embodiments where the assembly 200 is incorporated into display driver or sensor applications. In one embodiment, there are two contact pads 216 on the functional block 202 and the contact pads are situated diagonally to each other. In such embodiment, the dielectric film 210 has two vias 212 which are also situated diagonally to each other over the corresponding contact pads 216.

In one embodiment, the dielectric film 210 has a thickness ranging from about 5 µm to about 60 µm. In another embodiment, the thickness of the dielectric film 210 is approximately 38 µm. The dielectric can be either a wet film that is dried or cured, or as a dry film that is laminated onto the substrate 206.

In one embodiment, the dielectric film 210 has an adhesive functionality to the side that is applied to the substrate 206. The adhesive functionality could be an inherent property of the dielectric material or its application process, or it could be due to an adhesive film that is applied to the side of the dielectric film 210 that comes in contact with the substrate 206. In embodiments where an adhesive film is used to provide the adhesive to the dielectric film 210, the adhesive film is non-conductive and can be processed to achieve the desired structure for the via 212. For example, the adhesive film must be photo imageable or laser drillable to allow the via 212 to be formed. A laser drillable adhesive film could be fabricated by using an adhesive that inherently absorbs UV light, or else by using an adhesive formulation that consists of a UV-absorbing species. If an adhesive film is used on the dielectric film 210, all of the dimensions listed for the dielectric film 210, including film thickness and via diameter, applies to the dielectric and adhesive film combined together.

In one embodiment, the dielectric film 210 has a coefficient of thermal expansion (CTE) that is closely matched to that of the substrate 206. Preferably, the CTE is within ±20 ppm/° C. of the CTE of the base material of the substrate 206, which is typically 50-70 ppm/° C., but can vary depending on the substrate. The proximity of the dielectric film CTE to the substrate CTS is more important than the absolute value of the substrate CTE. Suitable dielectric materials include, but are not limited to polyimide, polyetherimide, liquid crystal polymer, and polyethylenenaphthalate.

In one embodiment, the vias 212 in the dielectric film 210 are formed over corner areas of the functional block 202. In one embodiment, the vias 212 are only formed over the corners of the functional blocks with the contact pads 216. Additionally, the dielectric film 210 may also be formed only in discrete or selected positions on or around the functional block 202 and around the area of the substrate 206 that has the functional block 202 deposited therein. When the dielectric film 210 is discretely or selectively formed, the vias 212 may not be necessary since the dielectric material may be selected to not form over the contact pads 216 to leave the contact pads 216 exposed. A method that can be used for selectively or discretely form the dielectric film 210 includes direct write, such as ink-jet, and laser assisted deposition, etc. Such method enables the deposition of the dielectric film 210 anywhere the material is needed. Additionally, such selective deposition of the dielectric film 210 enables customizing deposition of the dielectric film for uses such as bridging or covering the gap from the functional block 202 to the substrate surface 208, and/or to protect sensitive areas on the functional block 202. Such selective deposition of the dielectric film 210 minimizes the use of the dielectric material where it is not needed. Other methods that can be used for selectively or discretely form the dielectric film 210 include patterning, etching, and photolithography.

One advantage of a structure that incorporates a via or vias and a dielectric layer is that the dielectric layer is disposed between the functional block which can be an integrated circuit (IC) for a device and the conductive interconnect or conductive traces which could be use to connect the functional block to an external electronic element such as an antenna. The via formed through the dielectric layer provides a direct electrical connection to the IC, but there is still a capacitive coupling between other parts of the functional blocks and the external electronic element. It is disadvantageous to have such capacitive coupling between the IC and the conductive traces, and this capacitive coupling is increased due to proximity of the conductive traces to the IC. Placing the dielectric layer between the functional block and the external electronic element provides some vertical distance between them. Minimizing the size of the interconnection pad, and increasing the vertical distance between the traces and IC, minimizes this capacitive coupling. Additionally, the use of low dielectric constant materials as the dielectric layer will also minimize this capacitive coupling. Examples of low-dielectric constant materials include porous materials, fluorinated materials, and silicon-rich materials.

In one embodiment, each conductive interconnect 214 formed on top of and into the dielectric layer 208 fills a particular vias 212 so as to establish electrical interconnection to the functional block 202. In the present embodiment, each conductive interconnect 214 constitutes both a via conductor 214-V as well as a pad conductor 214-P. When each of the conductive interconnects 214 fills a via 212, the conductive material covers all of the exposed area of the contact pad 216 that is exposed by the via 212. In one embodiment, the conductive interconnect 214 constitutes a conductive trace of an antenna element or acts as an interconnect for an antenna element. The conductive interconnect 214 can also interconnect the functional block 202 to an external electrical element or elements (e.g., antennas or electrodes). The conductive interconnect 214 can also be an electrical or conductive lead from the external electrical element.

In one embodiment, the conductive interconnect 214 is formed using a roll-to-roll process. For example, materials used to form the interconnect 214 is deposited onto and into the dielectric layer 208 as the substrate 208 is processed on a web line. Material used to make the conductive interconnect 214 may be selected such that it can be cured, for example, by heat or by electromagnetic radiation, or by ultraviolet radiation, and can be used in the roll-to-roll process. For example, the interconnect 214 material is cured as the substrate 206 is processed on a web line.

In one embodiment the conductive interconnect 214 is made of a conductive composite of conductive particles in a non-conductive matrix, such as silver ink. In another embodiment, the conductive interconnect 214 is made of metal or metals that are evaporated onto the substrate 206 or onto the dielectric layer 210, over the corresponding via 212, and subsequently patterned. The conductive interconnect 214 can also be comprised of an organic conductor, or composites of carbon nanotubes or inorganic nanowires dispersed in a binder. In one embodiment the conductive interconnect 214 is made of a conductive composite, such as silver ink or silver-filled epoxy that completely filled by the corresponding vias 212. In one embodiment, the conductive interconnect 214 is made of one or more of the following: conductive particles dispersed in a nonconductive or an organometallic matrix (e.g., silver ink), sputtered or evaporated metal, conductive carbon composite, carbon nanotubes, inorganic nanowires dispersed in a nonconductive matrix, and any of these materials combined with metallic nanoparticles. In one embodiment, the conductive interconnect 214 comprises a nonconductive matrix that consists of a thermoplastic polymer, a thermoset polymer, or a B-staged thermoset polymer. In one embodiment, the elastic modulus of a conductive composite that is used to form the conductive interconnect 214 is between 120,000 psi and 60,000 psi. The resistivity of the conductive interconnect 214 is less than 76 m$\Omega$/square/mil, more optimally, less than 60 m$\Omega$/square/mil, even more optimally less than 42 n$\Omega$/square/mil, and most optimally less than 25 m$\Omega$/square/mil.

Additionally, the conductive interconnect 214 is made of a material that is able to maintain good electrical contact to the top-most conductive feature or features (e.g., the contact pad 216) on the functional block 202, such that the combination of the substrate 206, the functional block 202, the dielectric layer 210, the contact pad 216, and the conductive interconnect 214 is able to maintain sufficient electrical contact throughout, with less than a 10% variation in total resistance. In one embodiment, the combination of the substrate 206, the functional block 202, the dielectric layer 210, the contact pad 216, and the conductive interconnect 214 is able to maintain sufficient electrical contact throughout, with less than a 10% variation in total resistance, when the assembly 200 is subjected to thermal cycles for 100 times from −40° C. to 85° C., and bent over a 1-inch-diameter mandrel for 80-100 times. Each conductive interconnect 214 can partially or completely cover the corresponding via 212 for the conductive material in the via 212 to make electrical contact to the functional block 202 or the corresponding contact pad 216 on the functional block 202. Additionally, the conductive interconnects 214 also have a good adhesion to the dielectric film 210, such that the interconnects can survive flexing over a 1-inch mandrel as previously mentioned.

In one embodiment, the conductive interconnect 214 is coupled to another conductive trace (not shown) that may be formed on the substrate 206. Such conductive trace can be an antenna trace, for example, when the assembly 200 is to be incorporated into an RFID tag. Alternatively, the conductive interconnect 214 also forms the conductive trace for the final device itself. For example, the conductive interconnect 214 can also be part of an antenna element for an RFID tag. The conductive interconnect 214 and the conductive trace could be combined as one material applied in one process, or as two materials applied in two sequential steps.

In one embodiment, the interconnect 214 constitutes a via conductor 214-V and a pad conductor 214-P connecting to a particular contact pad 216. The via conductor 214-V contacts the conductive pad 216 on the functional block 202 at the bottom of the via 212. It is preferable that the via conductor 214-V covers all of the contact pad 216 that is exposed by the via 212.

In one embodiment, the top diameter or the top area of the via conductor 214-V is larger than the top diameter of the corresponding via 212. In one embodiment, the top diameter or the top area of the via conductor 214-V is about 1-3 times larger than the top diameter of the via 212. In another embodiment, top diameter or the top area of the via conductor 214-V is 1-2 times larger than the top diameter of the via 212.

The pad conductor 214-P, in one embodiment, provides a large or larger conductive area for fast electrical attachment of the assembly 200 to a conductor on another electrical functional element, such as a RFID antenna, a display driver strip, or a sensor assembly. In one embodiment, the pad conductor 214-P is at least (1 mm)×(1 mm) large. Since this interconnection area is larger than the connection or contact pad 216 on the functional block 202, lower-cost, lower-precision equipment can be used to produce electrical contact between the assembly 200 and other functional elements such as antennas. The pad conductor 214-P may be made of the same material or different material as the via conductor 214-V. The pad conductor 214-P must make electrical contact with any necessary conductive material in the via 212 (e.g., the via conductor 214-V) as well as the corresponding contact pad 216 that may be provided on the functional block 202.

Figure 2D:
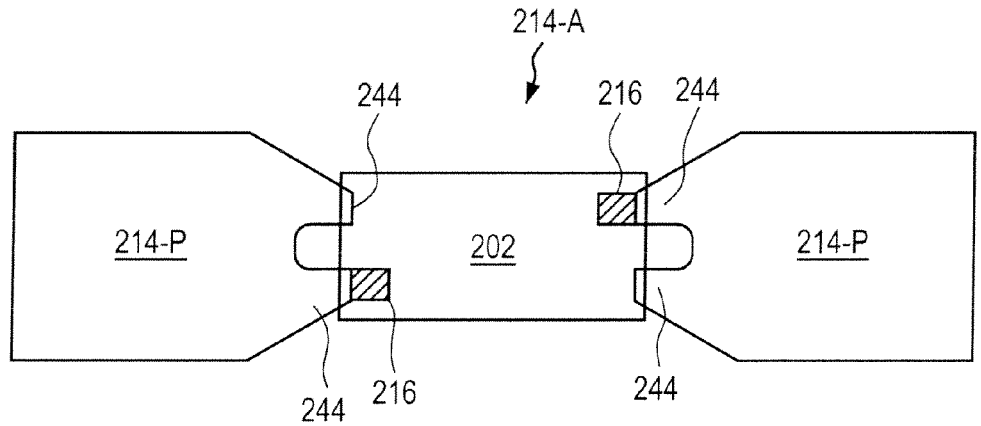
FIGS. 2D, 2E(a)-2E(b) and, 2F illustrate exemplary embodiments of a conductive interconnect coupling to a functional block.
Figure 2E:
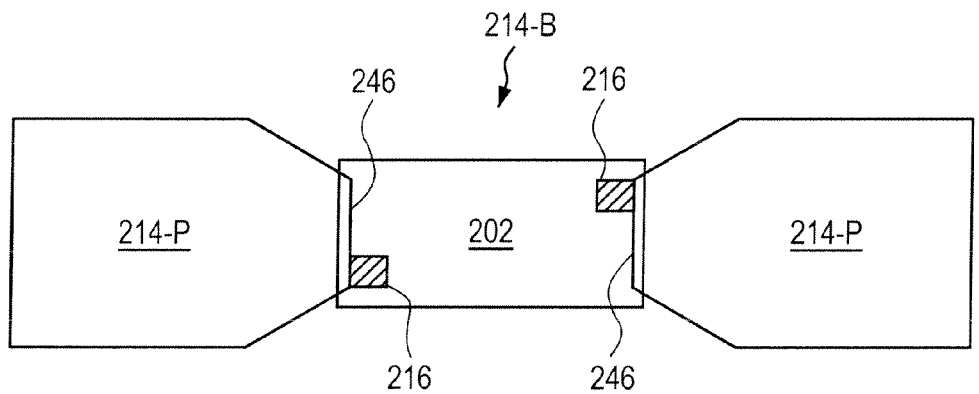
Figure 2E:
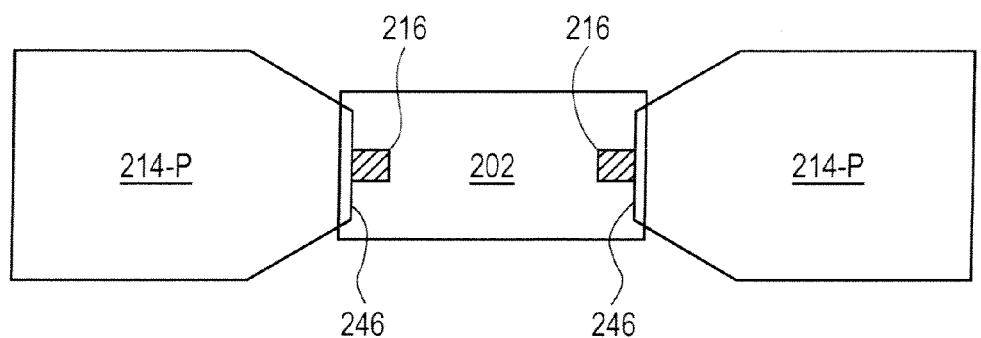
Figure 2F:
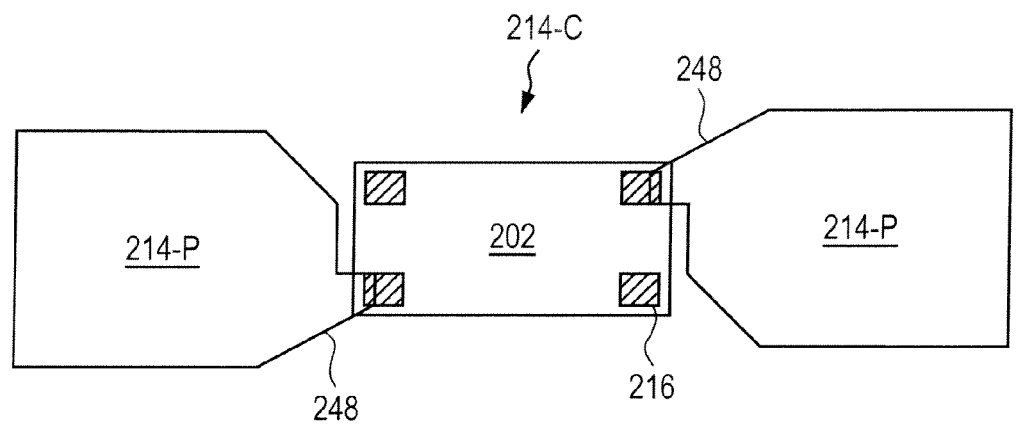
FIG. 2G illustrates an exemplary embodiment of incorporating the assembly formed in FIG. 2A to a second substrate (a device substrate)

The conductive interconnect 214 may have several layouts. Exemplary layouts are shown in FIGS. 2D-2F, below. The layouts in FIGS. 2D-2F illustrate exemplary configurations for the pad conductor 214-P of the conductive interconnects 214. It is to be noted that other configurations are also feasible.

Typically, the assembly 200 includes more than one interconnections 214 and more than one pad conductor 214-P. For instance, when the functional block 202 has two contact pads 216 so that multiple connections are needed. In FIG. 2D, a "bow-tie" configuration 214A is provided. In this configuration, two pad conductors 214-P form a bow tie like configuration. The configuration 214-A includes two pad conductors 214-P, each of which having two fingers 244 coming out of each pad conductor. The fingers 244 are able to make contact with each of the contact pad 216 at any of the 4 corners of the functional block 202. Each finger 244 would make contact to a contact pad 216 that is closest to the corresponding finger 244. It is preferred to have a limited amount of conductive interconnect 214 over the functional block 202 such that the amount of stray capacitance is limited. Thus, only a small section of each finger 244 overlaps the functional block 202 or a contact pad 216 provided on the block 202. In one embodiment, the finger 244 is less than or equal to the top diameter of the corresponding contact pad 216 that the finger 244 connects to. In one embodiment, the finger 244 covers a portion of the via conductor that connects to the contact pad 216. In one embodiment, the finger 244 covers all of the via conductor that connects to the contact pad 216. The bow-tie configuration 214A enables the conductive interconnect 214 to make contact to the functional block 202 where the contact pads 216 is placed on any of the four corners of the functional block 202. It may be that the functional block 202 has one contact pad 216. Thus, not all of the fingers 244 would contact a contact pad 216. The functional block 202 thus can also be deposited into a receptor 204 in a manner where the contact pads 216 can be oriented at any corner and still able to allow contact from the fingers 244 to the contacts pads 216.

In FIG. 2E, another "bow-tie" configuration 214B, which does not have the fingers 244 shown in the bow-tie configuration 214A is provided. Instead, in the bow-tie configuration 214B, sides 246 are provided on the pad conductors 214-P where each of the sides 246 runs across almost the length of each side of the functional block 202. In this configuration, two pad conductors 214-P also form a bow tie-like configuration over parts of the functional block 202. In the present embodiment, each of the sides 246 is placed in contact with a contact pad 216 on the functional block 202.

FIG. 2F illustrates an exemplary embodiment of a configuration of the conductive interconnect 214 or the pad conductor 214-P with a non-bow-tie configuration 214C. In the present embodiment, the functional block 202 may have contact pads 216 placed diagonally to each other. The configuration 214C is similar to the configurations 214A and 214B above except that only one arm is necessary on each pad. The configuration 214C is configured with two pad conductors 214-P each having an arm or extension 248 to make connection to one of the contact pads 216. The arm 238 allows the conductive interconnect 214 to contact the functional block 202 with minimal conductive material over the functional block 202. Other configurations or shape for the extension 248 are possible. The configuration 214C is especially useful when the functional block does not have rotational symmetry that is greater than two folds.

In FIGS. 2D-2F, the contact pads 216 are shown to contact the fingers 244 or the sides 246 of the pad conductor. As previously mentioned, the dielectric layer 210 may be formed over the block 202 and the vias 212 are created in the dielectric layer 210 so that the contact pads 216 are exposed. The vias are filled with conductive interconnects 214 or via conductors 214-V as previously mentioned. As previously mentioned, the via could also be filled by the same material and at the same time as the sides 246 are formed. The fingers or sides from the pad conductors 214-P cover at least a portion of the corresponding via conductors 214-V to establish interconnection to the contact pads 216. For the sake of illustrating the pad conductor layouts, the vias 212 and the via conductors 214-V are not shown in FIGS. 2D-2F.

In one embodiment, each pad conductor 214-P has a resistivity that is less than 25 mΩ/square/mil, optimally less than 18 mΩ/square/mil, and most optimally less than 12 mΩ/square/mil.

In one embodiment, each part of the pad conductor part 214-P that is over the via conductor should be no wider than 2 times the smallest diameter of the corresponding via conductor 214-V, optimally no wider than 1.5 times the diameter of the via conductor 214-V, and more optimally, the same width as the widest diameter of the via conductor 214-V.

Figure 2G:
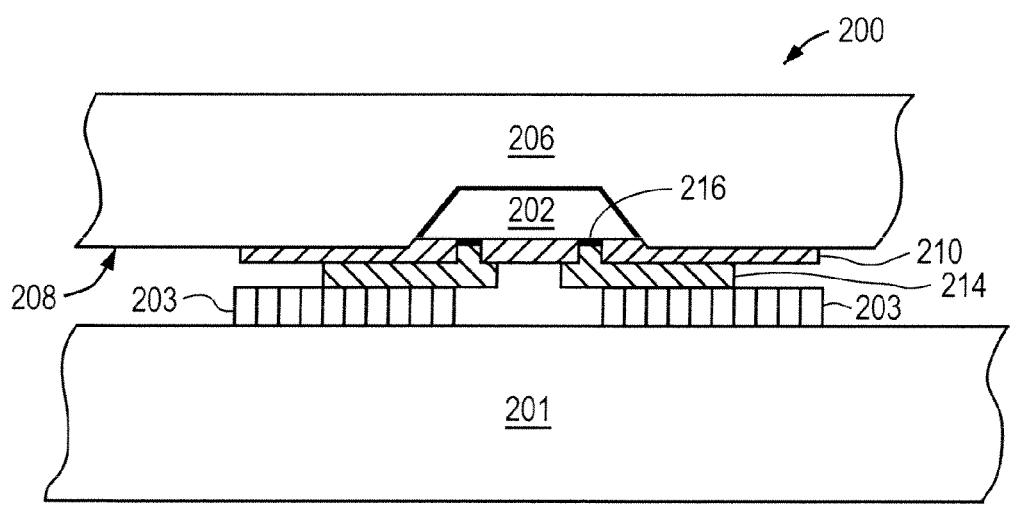

The assembly 200 shown in FIG. 2A can be referred to as a strap assembly. In one embodiment, the strap assembly 200 is further coupled or attached to another device for form a final device (for example, to form an RFID tag). FIG. 2G illustrates a cross-sectional view of the strap assembly 200 being attached to a second substrate or a device substrate 201. The substrate 201 may include other active elements and/or electrical components and in one embodiment, includes a conductor pattern 203 formed thereon. In one embodiment, the conductor pattern 203 is part of an antenna element that can be used for an RFID device. In one embodiment, the substrate 206 is "flipped" over such that the surface 208 is facing the second substrate 201 and the conductor pattern 203. The substrate 206 is attached to the second substrate 201 in a way that the conductor pattern 203 is coupled to the interconnects 214. Conductive adhesives may be used to facilitate the attachment of the strap assembly 200 to the substrate 206. Other sealing materials can also be added.

In one embodiment, the substrate 206 is a monolayer plastic film such as the substrate 206 shown in FIG. 2A. A plastic monolayer base film can be a thermoset or an amorphous or semicrystalline thermoplastic plastic film. In one embodiment, the substrate 206 is a thermoplastic base film and has a glass transition temperature (Tg) of at least about 100° C., more optimally at least about 125° C., and even more optimally at least about 145° C. The thermoset plastic film can be selected from UV-curable, moisture-curable, and heat-curable thermoset plastic films. Example of suitable materials that can be used for the substrate 206 include, but are not limited to, polyethylene, polystyrene, polypropylene, polynorbornene, polycarbonate, liquid crystal polymer, polysulfone, polyetherimide, polyamide, polyethyleneterephthalate, and polyethylenenaphthalate, and derivatives thereof.

Figure 3:
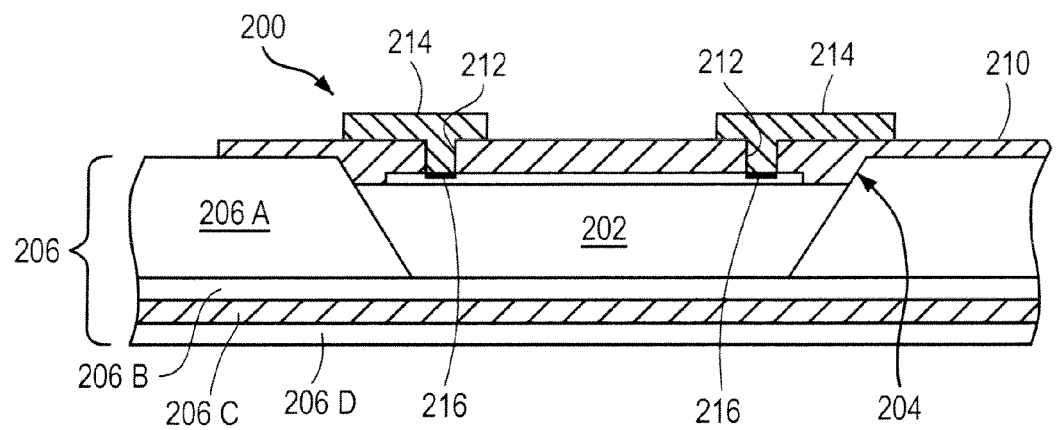
FIG. 3 illustrates an exemplary embodiment of an electronic assembly with the functional block deposited therein and the substrate being multi-layered.

In alternative embodiments, the substrate 206 comprises multiple layers for example, layers 206A-206D, with the recessed regions 204 formed in one (or more) of the layers, e.g., the top layer 206A and with the additional layers used to provide one or more of dimensional stability, mechanical strength, dielectric properties, desired thickness, functionalities, etc. (FIG. 3).

The substrate 206 is made of a material that minimizes positional distortion of the recessed region 204 after the substrate 206 is subjected to a first thermal excursion for about 30 minutes at about 125° C. Prior to assembling the functional block 202 into the recessed region 204, the substrate 206 is subjected to at least one thermal excursion cycle for about 30 minutes at about 125° C. During this thermal excursion cycle, the recessed region 204 that is formed into the substrate 206 may be distorted positionally. The position of the recessed region 204 on the substrate 206 may move or be distorted slightly due to the heat or change of material characterization due to heat. The substrate 206 must be made of a material that will cause only about 30-500 μm, more optimally, 30-300 μm, positional distortion to the location of the recessed region 204 that is formed on the substrate 206. Positional distortion refers to the location of the recessed region 204 being moved positionally from the originally created position on the substrate 206. In one embodiment, the substrate has a length of about 200 mm along which the distortion is measured. Thus, the substrate 206 is made of a material that when subjected to a first thermal excursion causes the recessed region to be move by only about 30-500 μm, or 30-300 μm. In another embodiment, the substrate could have a length that is about 300 mm or 500 mm long, and the allowance distortion along such a length would scale linearly with the distortion allowed along a shorter length.

In one embodiment, when the substrate 206 is subjected to a process that forms the recessed region 204, areas around the area where the recessed region 204 is to be formed is maintained at a temperature between about 50° C. and the glass transition temperature of the substrate material. Such temperature control minimizes distortion to the substrate 206 as the recessed region 204 is being formed.

The recessed region 204 is at least as large as the functional block 202 that fills the recessed region 204. More optimally, the recessed region 204 is slightly larger (e.g., 0-10 µm or 1-10 µm) than the functional block 202 in width, depth, and length, and has a sloping sidewall similar to that of the shaped functional block 202. In general, the recessed region matches the shape of the functional block. If the functional block 202 is square, the recessed region 204 is also square, and if the functional block 202 is rectangular, the recessed region 204 is also rectangular.

Figure 4:
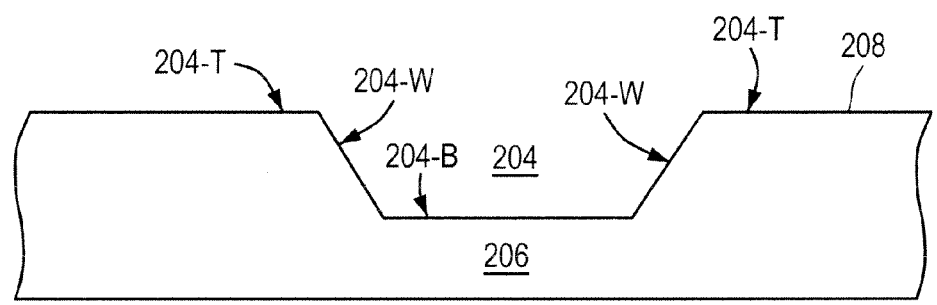
FIGS. 4-5 illustrate aspects of a recessed region formed in a substrate.
Figure 5:
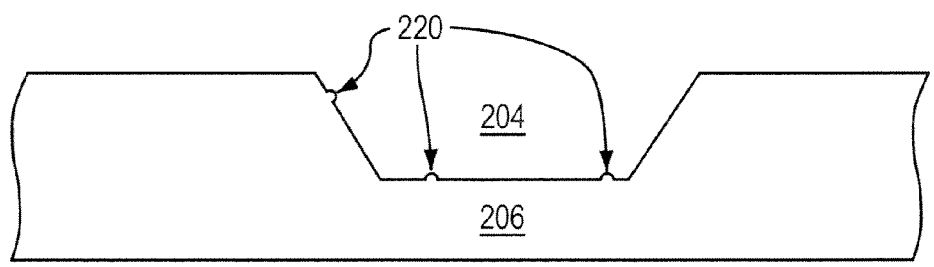

In one embodiment, the substrate 206 is substantially flat, especially in or near the recessed region 204. Substantially flat is characterized by surfaces of the substrate having no protrusion or no protrusion greater than 5 µm. In other words, if there are any protrusions at all, the protrusion is not greater than 5 µm, thus giving the substrate 206 a substantially flat characteristic. FIG. 4 illustrates an exemplary embodiment of the substrate 206 with a top surface 208 that is substantially flat. The substrate 206 only needs to have its top surface 208 (or alternatively, the top surface of the top layer of the substrate 206 when the substrate includes multiple layers) being substantially flat. As shown in FIG. 4, the sides of the recessed region 204 are substantially flat as well. Thus, top sides 204-T, bottom side 204-B, and sidewalls 204-W of the recessed region 204 are substantially flat with no protrusion. FIG. 5 illustrates an exemplary embodiment of the substrate 206 with some minor protrusions 220 along a surface of the substrate 206. Nevertheless, the protrusions 220 are so minor that the substrate 206 still has the substantially flat characteristic and that the recessed region 204 has sides that are substantially flat.

The recessed region 204 has a width-depth aspect ratio that is configured to substantially match a width-depth aspect ratio of the functional block 202. In one embodiment, the recessed region 204 has a width-depth aspect ratio that is less than 14:1, optimally, less than 10.5:1, and even more optimally, less than 7.5:1. The functional block 202 thus has a similar width-depth aspect ratio.

The substrate 206 is also selected so that the substrate has a good thermal stability to withstand standard processing. The material of the substrate 206 is such that the substrate 206 allows the recessed region 204 to maintain the same positional accuracy requirements previously mentioned. The substrate 206 is made of a material that is able to allow the recessed region 204 to maintain its positional accuracy after going through a 125° C.-150° C. thermal excursion.

In many embodiments, the assembly 200 is cut, sliced, separated, or singulated from a plurality of web-assembled assemblies as will be described below. Thus, a plurality of assemblies 200 can be formed in one short time frame. A roll-to-roll process can be used. A web substrate is provided. The web substrate may be a continuous sheet of web material which when coiled, is a roll form. A plurality of recessed regions 204 are formed into the web material using embodiments of the present invention, which will be described below. A plurality of functional blocks 202 are deposited into the recessed regions 204 on the web substrate (e.g., using an FSA process) to form a plurality of the assemblies 200 shown in FIG. 2A. Areas or strips of the web substrate can later be sliced, singulated, cut, or otherwise separated to produce individual assemblies 200. In one embodiment, a web sheet having a plurality of assemblies 200 is attached to another web substrate similarly to previously described in FIG. 2G. Individual devices can then be formed by slicing or singulating after the substrates are adhered to one another as illustrated in FIG. 2G.

Figure 6A:
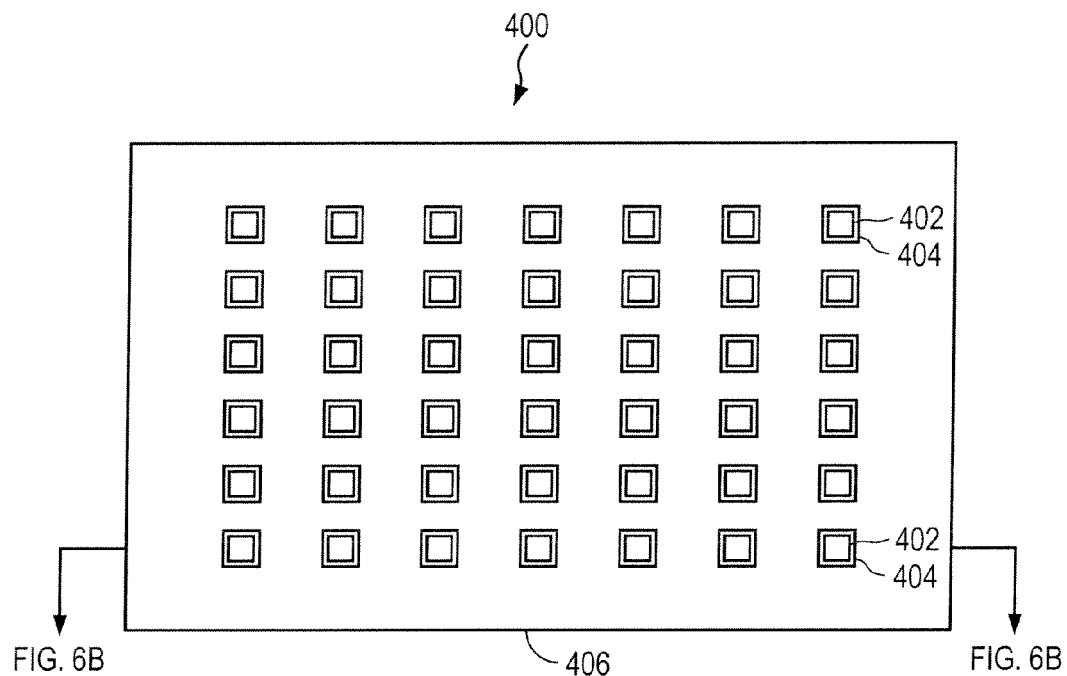
FIG. 6A illustrates an exemplary embodiment of an electronic assembly with multiple functional blocks deposited therein.
Figure 6B:
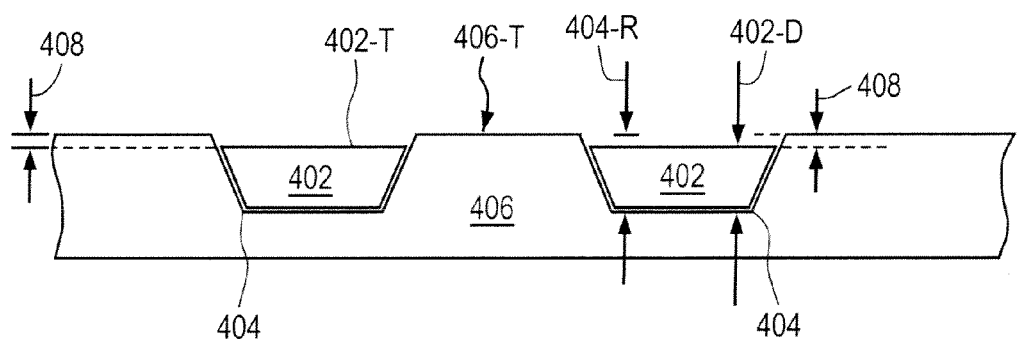
FIG. 6B illustrates an exemplary embodiment of an electronic assembly with multiple functional blocks deposited therein with the functional blocks being recessed below a surface of the substrate.

FIGS. 6A-6B illustrate an assembly 400 that includes several assemblies formed similarly to the assembly 200. The assembly 400 is similar to the assembly 200 above except when multiple assemblies are formed on one piece of substrate material. In FIG. 6A, a substrate 406 includes a plurality of recessed regions 404 formed therein. Each recessed region 404 includes a functional block 402 deposited therein. The assembly 400 is also similar to the assembly 200 shown above except that there are more of the functional blocks deposited in the substrate. Singulating areas of the substrate 406 after the functional blocks 402 have been deposited and other elements formed thereon can produce a plurality of assemblies 200 shown above. The substrate 406 can be a web substrate, a frame of a web substrate, a section of a web substrate, or a sheet substrate.

In terms of recessed regions' depth, it is important to take into account the entire population of the depths 404-R of the recessed regions 404 and the thicknesses 402-D of the functional blocks 402. The thickness 402-D of each of the functional blocks 402 should account for any contact pads on top of the functional block 402. In one embodiment, after all the functional blocks 402 are deposited into their corresponding recessed regions 404, a substantial amount of the plurality of functional blocks 402 are recessed below a top surface 406-T of the substrate 406. In one embodiment, there is a gap 408 between the top surface 402-T of the functional block 402 and the top surface 406-T of the substrate 406. In one embodiment, the gap 408 is between about 0-10 µm. In one embodiment, the substantial amount of the functional blocks 402 being recessed below the surface of the substrate 406 is defined by (1) less than 10% of the plurality or the population of the functional blocks protrudes above the top surface 406-T of the substrate 406; (2) less than 1% of the plurality of the functional blocks 402 protrude above the top surface 406-T of the substrate 406; (3) more than 90% of the plurality of the functional blocks 402 are recessed below the top surface 406-T of the substrate 406; or (4) more than 99% of the plurality of the functional blocks 402 are recessed below the top surface 406-T of the substrate 406.

The populations of the depths 404-R of the recessed regions 404 and the thicknesses 402-D of the functional block thickness can be represented by distribution with an average thickness or depth ($\mu_r$ or $\mu_N$, respectively) and a standard deviation ($\sigma_r$ or $\sigma_N$, respectively). The probability that a functional block 402 protrudes up from a recessed region 404 can be determined by comparing the difference ($\Delta$) in averages to the combined standard deviation, $\sigma_c$, where $$\Delta = \mu_r - \mu_N$$

and $$\sigma_c = \sqrt{\sigma_r^2 + \sigma_N^2}.$$

It is desirable to have $\sigma_c < \Delta$. More preferably, using the equations above and applying Normal statistics, it is preferable to have $\sigma_c$ and $\Delta$ such that less than 10%, or more preferably less than 1%, of the plurality of the functional blocks 402 protrude above the top surface 406-T of the recessed regions 404.

In one embodiment, the assembly 400 is characterized by in that the locations of the recessed regions 405 on the substrate 406 have a good positional accuracy. In one embodiment, across a 158 mm-wide area of the substrate 406, the positional accuracy of each recessed region 404 is within 100 µm at 3σ, in another embodiment, within 50 µm at 3σ, and in another embodiment, within 30 µm at 3σ. These positional accuracy numbers also scale linearly with the width of the substrate 406. For example, when the substrate 406 has a width of about 316 mm the positional accuracy of the recessed regions 404 is within 200 µm at 3σ. Similar to the assembly 200, the assembly 400 includes a dielectric film formed over the functional blocks 402, vias formed in the dielectric film to expose contact pads on the functional blocks 402, and conductive interconnections to establish electrical connections to the functional blocks 402.

The substrate 206 or 406 with recessed regions previously described can be processed using various exemplary methods and apparatuses of the present invention to form the recessed regions.

In one embodiment, a template with protruding structures is used to create recessed regions in a substrate. The template is pressed against the substrate to create recessed regions or holes in the substrate. In one embodiment, an embossing die is used to form a plurality of recessed regions in a substrate. The embossing die is configured to form a gradual ramp in the substrate at specified area of the substrate. A specified area of the substrate can be referred to as a frame of substrate in which an array or arrays of recessed regions are formed. See for example FIG. 6A, the substrate 406 can be referred to as a frame of substrate with an array of recessed regions 404 and functional blocks 402. In one embodiment besides forming the recessed regions, the embossing die also forms a gradual ramp between each two frames of substrates. The gradual ramp thus defines and separates one frame from another frame.

Many embossing processes used to form the recessed regions utilize hot embossing processes where an embossing die with protruding features is pressed into a substrate. Typically, the embossing is performed at an elevated temperature so that the substrate can be soft or hot in order for the recessed regions to be easily formed into the substrate. In such processes of hot embossing a substrate, the embossing die is forcibly pressed into the heated substrate causing the substrate material to flow locally around and into features of the embossing die. While such processes can accurately produce a negative image of the die features with relative ease, it is difficult to control the depth to which the edges of the embossing die presses into the substrate. Thus, when a long web of substrate material is embossed one frame (or one area) at a time, for example, in a step-and-repeat fashion, abrupt steps of varying height are generated around the edges of each embossed frame of substrate. Thus, from one frame to another there is an abrupt and non-controlled step formed in the substrate. These processes can have severe negative impacts on subsequent web processes such as a FSA process used to deposit functional blocks into the recessed regions or lamination and/or depositions of materials onto the web substrate. For instance, abrupt steps of varying height makes the FSA process hard to predict and control. Additionally, in the FSA process, the slurry carrying the functional blocks to be deposited into the recessed regions may be interrupted uncontrollably thus impacting the efficient depositing of the blocks into the recessed regions.

Figure 7A:
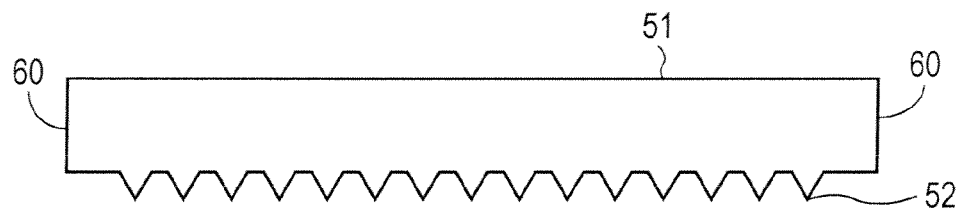
FIGS. 7A-7D illustrate what happens to a substrate when a template with a straight edge is used to create recessed regions in the substrate.
Figure 7B:
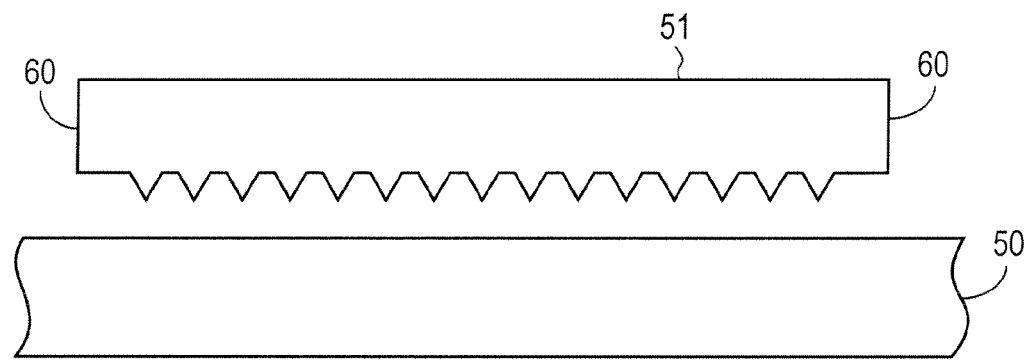
Figure 7C:
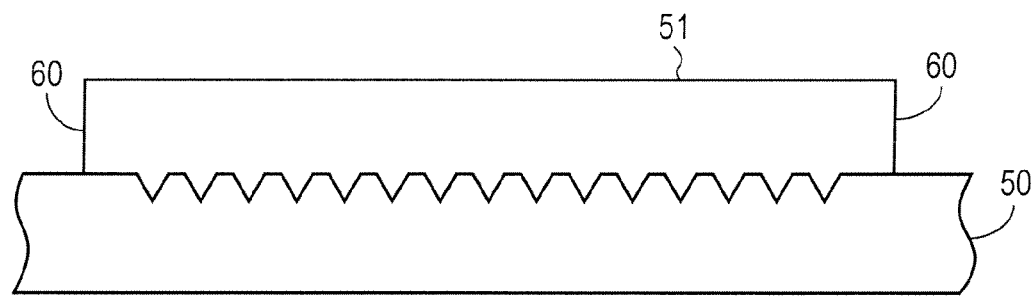
Figure 7D:
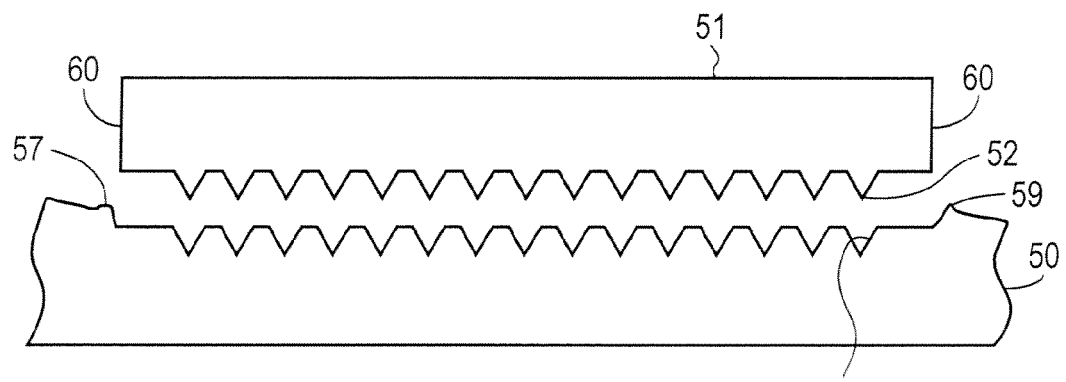

FIGS. 7A-7D illustrate the concept stated above. FIG. 7A shows an embossing die 51 with protruding structures 52 and straight edges 60. The protruding structures 52 may vary in shapes and sizes depending upon the object that is to be placed into a substrate or web material. FIG. 7B shows the embossing die 51 facing one side of a substrate 50. FIG. 7C shows the embossing die 51 contacting the substrate 50 and the protruding structures 52 from the template 51 pierce or press into the substrate 50. The straight edges 60 also contact the substrate 50 and may penetrate the substrate to a certain depth. FIG. 7D shows that when the template 51 is separated from the substrate 50, recessed regions or holes 53 are created in the substrate 50 and that step-changes 57 and 59 are also created into the substrate 50. The step-changes 57 and 59 are formed at or around the area of the substrate that the straight edges 60 contact the substrate 50. The step-changes 57 and 59 are often not uniform or continuous in the same direction from frame to frame. These step-changes 57 and 59 can interrupt the flow of the functional blocks during the FSA process or can cause problems in subsequent lamination and/or deposition processes and therefore are detrimental to the processes.

Figure 7E:
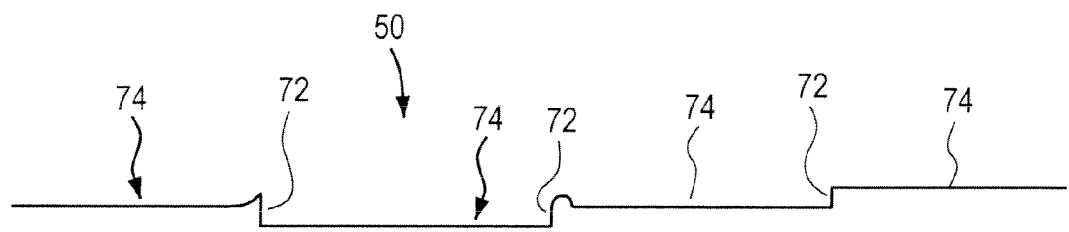
FIGS. 7E-7F illustrate non-uniform or inconsistent step-changes between frames of a substrate.
Figure 7F:
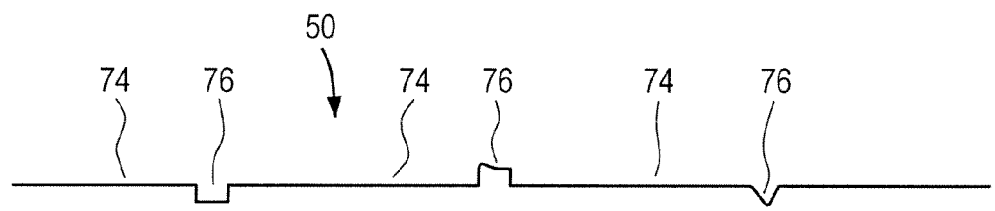

FIG. 7E illustrates a cross-sectional view of an example of step-changes created between frames of a web substrate 50 using an embossing process such as the one described above. Similar step-changes can also be caused by processes such as roll-to-roll and continuous processing. For example, a continuous belt that may be present in the processing may very well cause similar step-changes. In this figure, step-changes 72 are formed between each two frames 74 of the web substrate 50. As can be seen, the step-changes 72 are not uniform or continuous in the same direction from frame to frame. Similarly, as shown in FIG. 7F, step-changes can include channels or indentations 76 that are formed between frames 74. These types of step-changes should be avoided in the web substrate. These step-changes 72 or 76 unpredictably interrupt the flow of the functional blocks during the FSA process, and therefore are detrimental to the process.

Figure 7G:
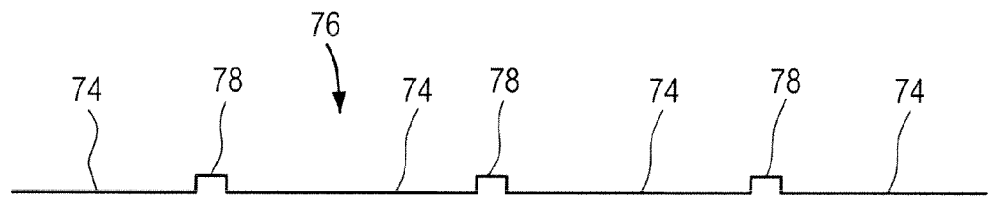
FIGS. 7G-7H illustrate an exemplary embodiment of the present invention with consistent step-changes between frames of a substrate.
Figure 7H:
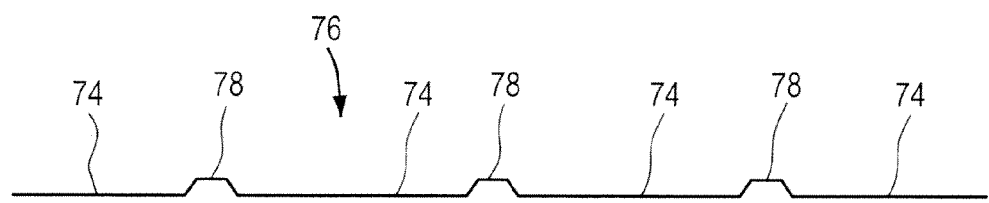
Figure 7I:
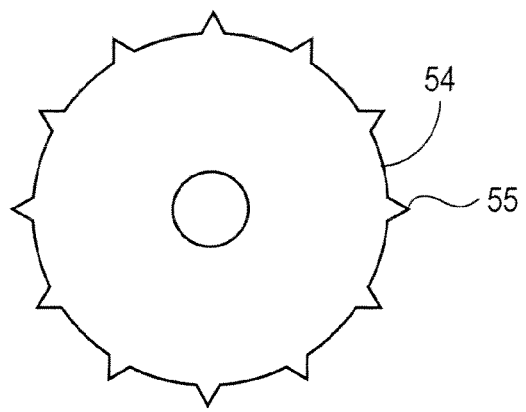
FIGS. 7I-7M illustrate an exemplary embodiment that uses a roller with features to create recessed regions in a substrate.
Figure 7J:
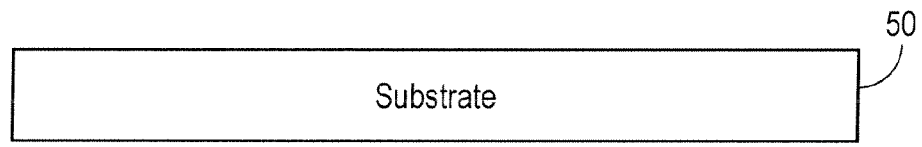
Figure 7K:
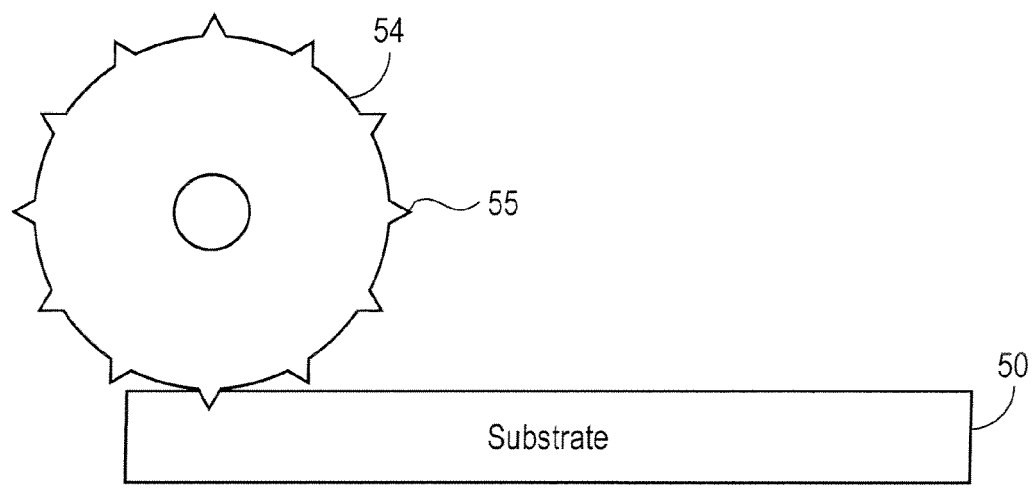
Figure 7L:
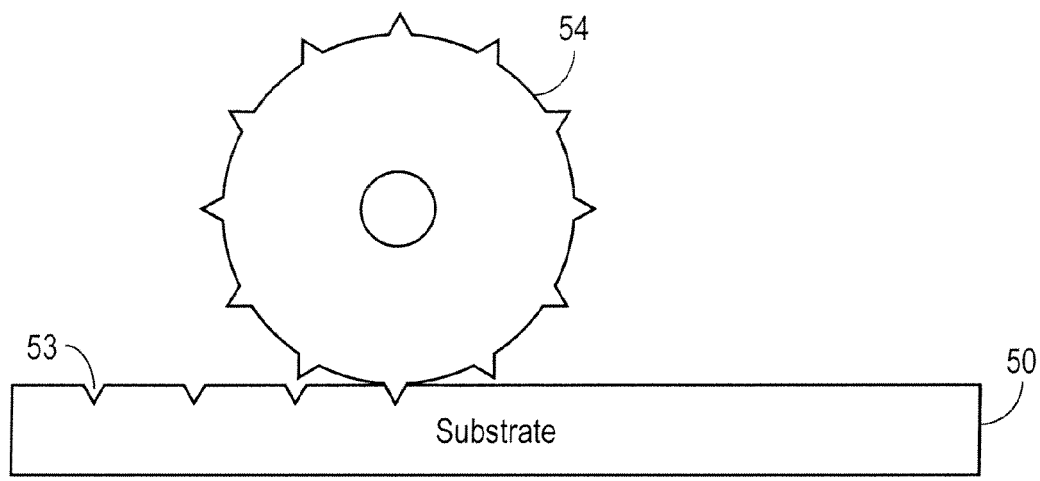
Figure 7M:
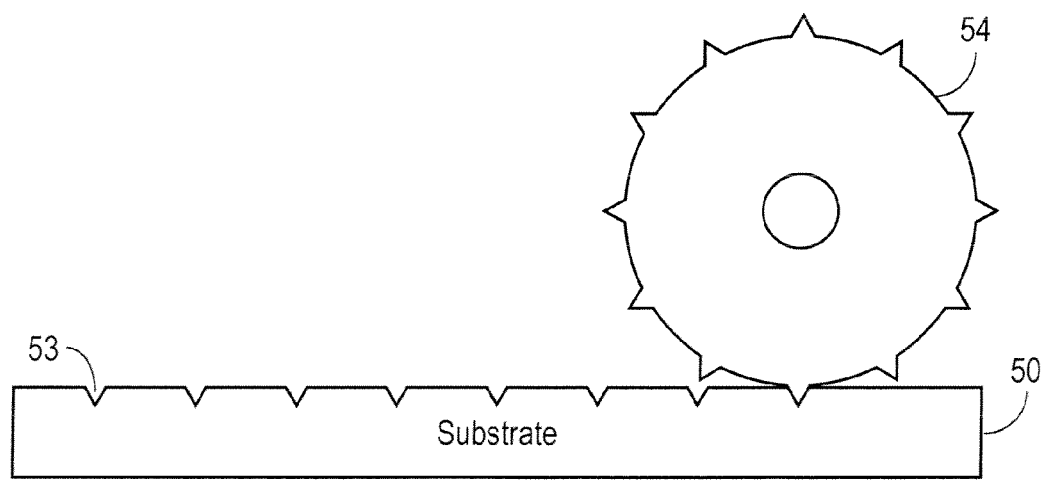

A step-change between frames may be acceptable in the web substrate if the step change is always in the same direction. That way, the FSA process can be controlled or monitored accordingly to a predictable presence of a step-change that is always in the same direction for an entire web or section of substrate. In one embodiment, a step-change is created into the web substrate such that when examining the space between two frames on the web substrate, there is a step going from one frame to the next, and that the step can be configured to always be higher on the left side, or always higher on the right side, or always in the same direction. For instance, as illustrated in FIG. 7G, a web substrate 76 is formed such that there are a plurality of frames 74. Each frame 74 is separated from another frame by a step-change 78. The step-change 78 is consistently in the same direction from one frame 74 to the next frame 74. Figure H illustrates another example of a consistent or uniform step-change between two frames of the web substrate 76. One advantage of the consistent step-change is that the flow of FSA slurry is not disrupted by the step-changes 78 unexpectedly and thus, the FSA process can be more controlled. A template or mold used to create the recessed regions may incorporate a feature that creates such a step-change in the web substrate.

In embodiments of the present invention, an embossing die with gradually sloping edges is provided. The embossing die includes the necessary features to form recessed regions on a substrate and also include one or more gradually sloping edges wherein the vertical extent of the slope exceeds the maximum depth of the embossing or penetration depth. In these embodiments, the embossing die embosses a gradually sloping perimeter around each frame of the substrate. The edges can also be configured so that the angle and contour of the slope create a gradual ramp at a perimeter of each frame of the substrate. The edges are configured so that the angle and contour of the slope cause the perimeters around each frame to have a predetermined molded shape that has negligible impact on subsequent web processes.

FIGS. 8A-8F illustrate an exemplary embodiment with an embossing die 80A equipped with gradually sloping edges 81 and 89 and features 82. The gradually sloping edge 81 is the left side edge and the gradually sloping edge 89 is the right side edge of the embossing die 80A. In FIGS. 8A-8F, both of the left side edge and the right side edge are gradual sloping edges. The features 82 are configured and dimensioned to create desired recessed regions in a substrate 83. In one embodiment, the features 82 are protruding structures and have feature dimensions that are 0.5-1% larger than the desired dimensions of the corresponding recessed regions to be formed on the substrate. In the present embodiment, the substrate will have the recessed regions formed with a pitch that has substantially similar pitch to the pitch of the recessed regions. The precise dimensions of the final product can thus be controlled. This is necessary so that sufficient alignment occurs through the assembling or fabrication process of the particular apparatus.

In one embodiment, the features 82 have a width-depth aspect ratio that is less than 10.5:1 or more optimally, less than 7.5:1. Additionally, the features 82 have the shapes that are the shapes (e.g., square, rectangle, oval round, or trapezoidal) of the corresponding functional blocks to be deposited in the recessed regions. The embossing die 80A may include an array of features 82 so as to form a corresponding array of corresponding recessed regions on the substrate 83.

The embossing die 80A can be made of sturdy materials (e.g., steel, metal, such as electroless nickel or copper, polymers, or other hard materials, etc.). In one embodiment, the embossing die 80A is an electroform stamper copy made from an electroform mother copy, which is made from a master mold that is made by either etching a silicon wafer or diamond turning machining a metal plate or roller. In another embodiment, the template is an electroform stamper copy made from master mold negative that is made by etching a silicon wafer. In another embodiment, the template is an electroform stamper copy made by welding together smaller electroform stamper copies to make a linear array (for example, x by 1) of stampers, where x>1. In another embodiment, is an electroform stamper copy made by welding together smaller electroform stamper copies to make a linear array (for example, x by y) of stampers, where both x and y are greater than 1.

Figure 8A:
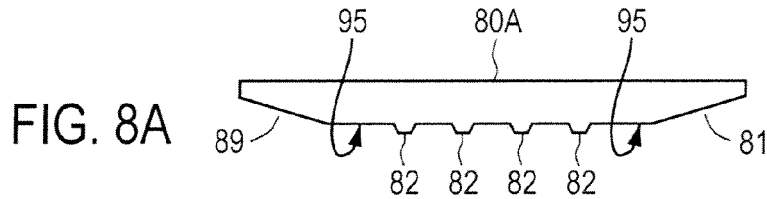
FIGS. 8A-8F illustrate an exemplary embodiment of an embossing die with gradually sloping edges that can be used to make recessed regions in a substrate in accordance to embodiments of the present invention.
Figure 8B:
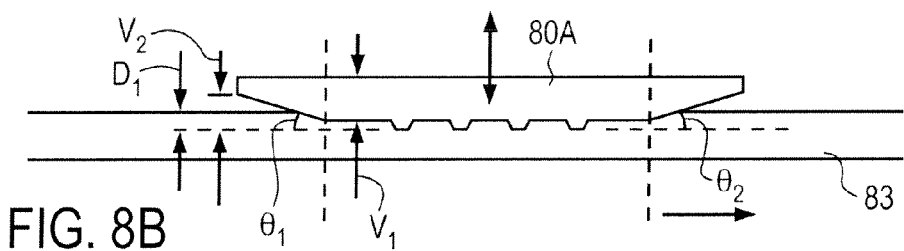

In one embodiment, the sloping edge 81 and 89 is configured to have a slope with a fixed angle and a sharp break for the plane of the embossing face 95. As illustrated in FIG. 8B, the sloping edge 81 has a fixed angle $\theta_2$ and the sloping edge 89 has a fixed angle $\theta_1$. Each of the angles $\theta_1$ and $\theta_2$ forms about 10-15 degrees to the plane of the embossing face 95. There is thus a sharp break from the embossing face 95 to each of the sloping edges 81 and 89. The degrees of the fixed angles $\theta_1$ and $\theta_2$ forms also characterize the gradualness of the edges 81 and 89. When the embossing die 80A is pressed into the substrate 83, at least a portion of each of the sloping edges 81 and 89 penetrates the substrate 83 as shown in FIG. 8B. The vertical distance $V_1$ of the embossing die 80A exceeds the maximum penetration depth D1 in the substrate 83 that the embossing die 80A will penetrate. In addition, the vertical distance $V_2$ of each of the sloping edges 81 and 89 also exceeds the maximum penetration depth D1 in the substrate 83 that the embossing die 80A will penetrate.

The sloping edges 81 and 89 can be created using techniques such as diamond machining or other precision machining. Alternatively, the sloping edges 81 and 89 can be created using techniques such as edge filing, sanding, buffing, or bending of a die plate. Alternatively, the sloping edges 81 and 89 can be created using techniques such as EDM (Electric Discharge Machining), patterned chemical etching, patterned sand-blasting, patterned bead-blasting, hammering, and forging.

Figure 8C:
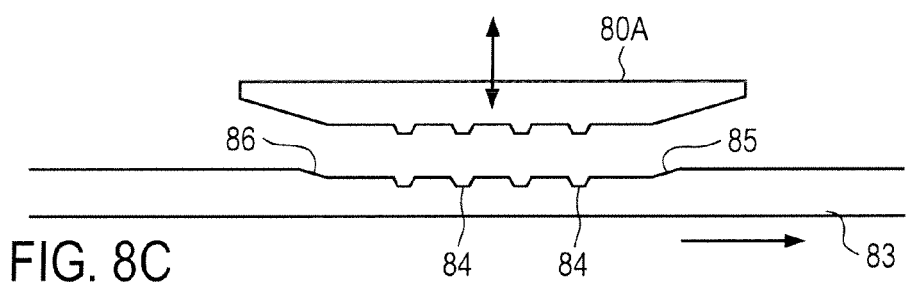
Figure 8D:
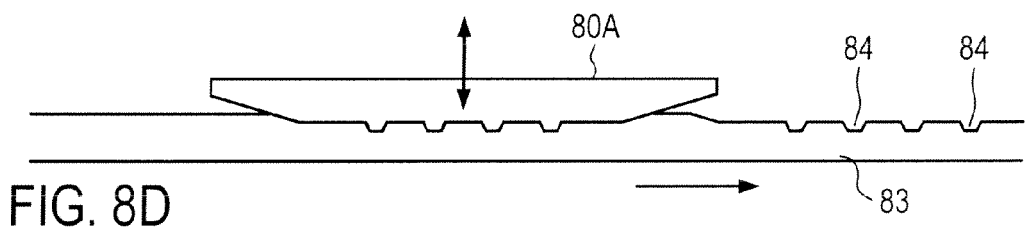
Figure 8E:
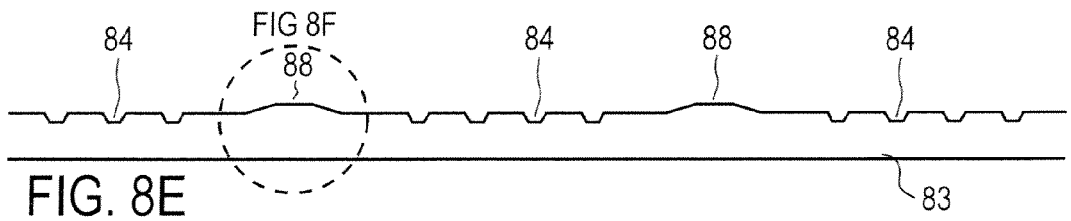
Figure 8F:
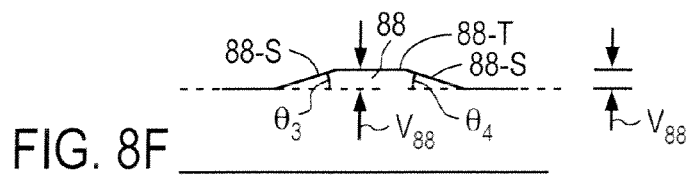

After the embossing die 80A is pressed into the substrate 83 (through a vertical motion) as illustrated in FIG. 8B, the embossing die 80A is removed from the substrate 83 and the substrate 83 may advance (FIG. 8C) so that a new section of the substrate 83 can be treated as illustrated in FIG. 8D. The substrate 83 may be supported on a platform in order for the die 80A to press into a stationary substrate 83 to create the recessed regions. Recessed regions 84 are created into the substrate 83 as illustrated in FIG. 8C. Additionally, a first indentation 85 is created on the side of the substrate that meets the sloping edge 81 and a second indentation 86 is created on the side of the substrate that meets the sloping edge 89. Each of the first indentation 85 and the second indentation 86 has an angle of about 10-15 degrees with respect to the top surface of the substrate 83. In FIG. 8D, the embossing die 80A is embossing (or treating) another section or frame of the substrate 83. In one embodiment, the substrate 83 and the embossing die 80A are aligned over each other such that a plateau 88 will be formed between the previous frame and the subsequent frame of the substrate 83 as shown in FIG. 8E. The sloping edges 81 and 89 are pressed into the substrate 83 such that new indentations similar to the first indentation 85 and the second indentation 86 are form. In one embodiment the gradual sloping characteristic of the indentions enable the formation of a gradual ramp between two frames of substrate 83. The indentations together form a plateau 88 as illustrated in FIG. 8E. As shown in FIG. 8E, after several frames of substrate 83 are embossed with the recessed regions 84, a plateau 88 or a gradual ramp is formed between each two frames of the substrate. FIG. 8F illustrates each plateau 88 in more detail in which the plateau 88 includes a top surface 88-T with sides 88-S. The two sides 88-S form $\theta_3$ and $\theta_4$ angles of about 10-15 degrees. The plateau 88 thus has gradually sloping sides as created by the sloping edges 81 and 89. In one embodiment the plateau 88 has a maximum vertical distance $V_{88}$ being less than 100 μm The gradual sloping edges create a feature in the substrate located between each two frames of substrate. The feature is illustrated by the plateau 88. The feature also has a slope that corresponds to the slope of the sloping edges; for example, the slope forms an angle of about 10-15 degree to the surface of the substrate. Using the embossing die 80A, the feature or a plateau 88 can be controllably formed between frames of substrate. The die 80A is configured so that the plateau 88 does not negatively impact or disturb the flow of FSA or subsequent processing to the substrate 83.

FIGS. 9A-9E illustrate another exemplary embodiment with the embossing die 80A previously discussed. In this embodiment, the embossing die 80A and the substrate 83 are aligned such that the indentations 85 and 86 cancel each other out in a subsequent embossing step from one frame to the next frame. Thus, the sloped indentation 85 and 86 are arranged so that they overlap from one frame to the next to result in a flattened section 87.

Figure 9A:
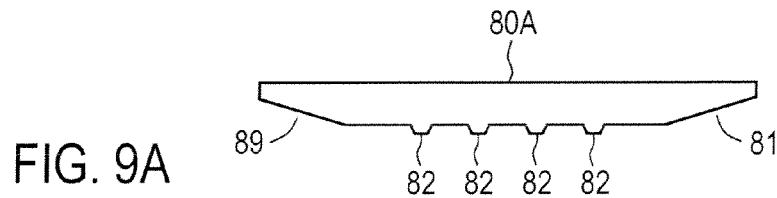
FIGS. 9A-9E illustrate an exemplary embodiment of an embossing die with gradually sloping edges that can be used to make recessed regions in a substrate in accordance to some embodiments of the present invention.
Figure 9B:
Figure 9C:
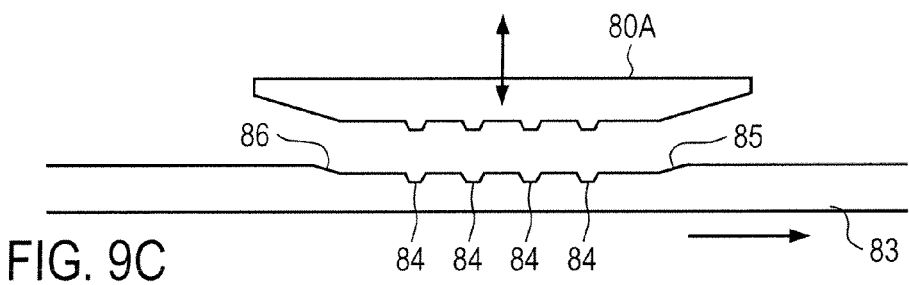
Figure 9D:
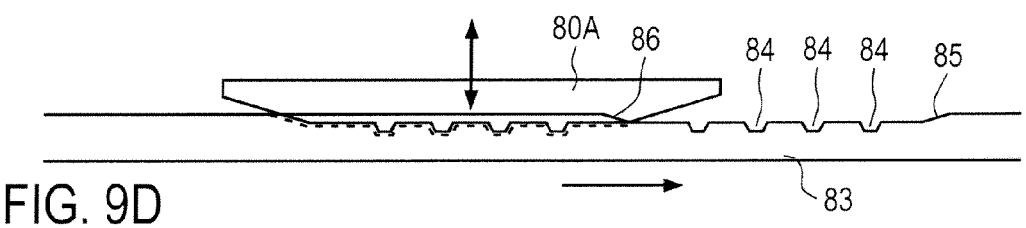
Figure 9E:
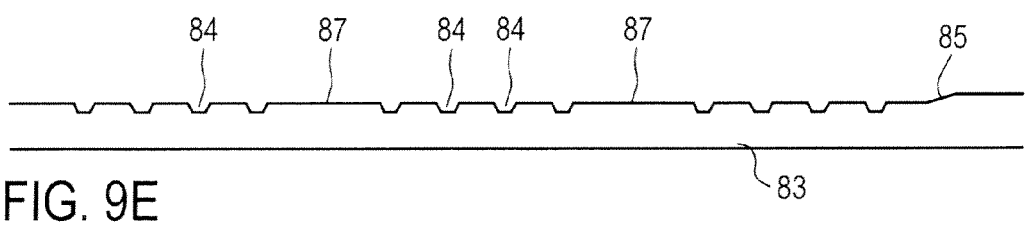

After the embossing die 80A is pressed into the substrate 83 (through a vertical motion) as illustrated in FIG. 9B, the embossing die 80A is removed from the substrate 83 and the substrate 83 may advance (FIG. 9C) so that a new section of the substrate 83 can be treated as illustrated in FIG. 9D. The recessed regions 84 are created into the substrate 83 as illustrated in FIG. 9C. Additionally, a first indentation 85 is created on the side of the substrate that meets the sloping edge 81 and a second indentation 86 is created on the side of the substrate that meets the sloping edge 89. Each of the first indentation 85 and the second indentation 86 has an angle of about 10-15 degrees with respect to the top surface of the substrate 83. In FIG. 9D, the embossing die 80A is embossing (or treating) another section or frames of the substrate 83. In one embodiment, the substrate 83 and the embossing die 80A are aligned over each other such that a flattened section 87 will be formed between the previous frame and the subsequent frame of the substrate 83 as shown in FIG. 9E.

In a subsequent frame, the embossing die 80A is aligned over the substrate 83 such that the sloping edge 81 overlays with the indention 86 from a previous frame. As the die 80A is pressed into the substrate 83, the sloping edge 81 flattens out the indention 86 from the previous frame. As can be see in FIG. 9C after one frame is embossed, the substrate 83 is advanced so that the indentation 86 is aligned under the sloping edge 81 as shown in FIG. 9D. After the embossing is completed for the second frame, the indentions cancel each other out to leave a relatively flattened section 87. In the present embodiment, there may be a small or negligible indentation (not shown) formed at the flattened section 87. The resulting frames of substrate 83 after the embossing will appear as illustrated in FIG. 9E.

FIGS. 10A-10G illustrate another exemplary embodiment with an embossing die 80B equipped with gradually sloping edges 81 and a straight edge 90 and features 82. As previously mentioned, only one gradually sloping edge is needed to control the configuration of the region between frames of substrate. The features 82 are configured and dimensioned to create desired recessed regions in a substrate 83. Similar to the embossing die 80A, in one embodiment, the features 82 are protruding structures and have feature dimensions that are 0.5-1% larger than the desired dimensions of the corresponding recessed regions to be formed on the substrate.

In one embodiment, the features 82 have a width-depth aspect ratio that is less than 10.5:1 or more optimally, less than 7.5:1. Additionally, the features 82 have the shapes that are the shapes of the corresponding functional blocks to be deposited in the recessed regions.

The embossing die 80B can be made of similar materials and using similar techniques as the embossing die 80A above. In one embodiment, the embossing die 80B is an electroform stamper copy made from an electroform mother copy, which is made from a master mold that is made by either etching a silicon wafer or diamond turning machining a metal plate or roller. In another embodiment, the template is an electroform stamper copy made from master mold negative that is made by etching a silicon wafer. In another embodiment, the template is an electroform stamper copy made by welding together smaller electroform stamper copies to make a linear array (for example, x by 1) of stampers, where x>1. In another embodiment, is an electroform stamper copy made by welding together smaller electroform stamper copies to make a linear array (for example, x by y) of stampers, where both x and y are greater than 1.

Figure 10A:
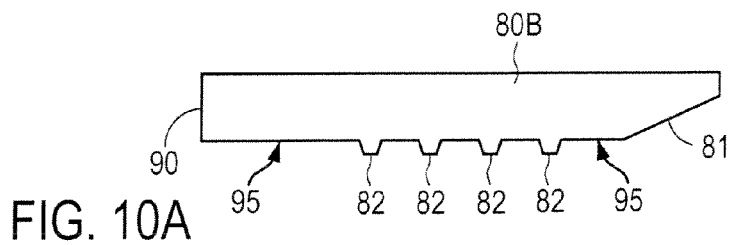
FIGS. 10A-10G illustrate another exemplary embodiment of an embossing die with gradually sloping edges that can be used to make recessed regions in a substrate in accordance to embodiments of the present invention.
Figure 10B:
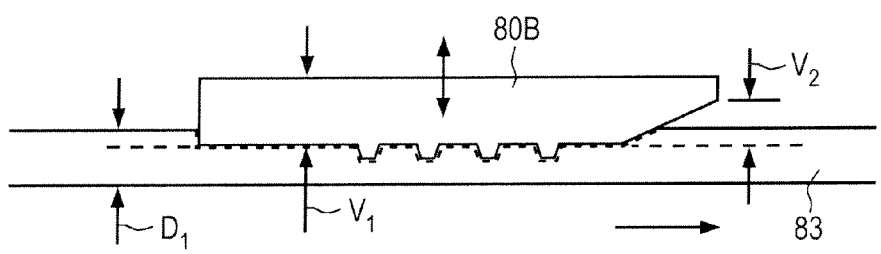

In one embodiment, similar to the embossing die 80A, the sloping edge 81 of the embossing die 80B is configured to have a slope with a fixed angle and a sharp break for the plane of the embossing face 95. As illustrated in FIG. 10B, the sloping edge 81 has a fixed angle $\theta_5$. The angle $\theta_5$ forms a 10-15 degree angle to the plane of the embossing face 95. The straight edge 90 has a fixed angle $\theta_6$. The angle $\theta_6$ forms a 90-degree angle to the plane of the embossing face 95. There is a sharp break from the embossing face 95 to each of the sloping edge 81 and the straight edge 90. When the embossing die 80B is pressed into the substrate 83, at least a portion of each of the sloping edge 81 and the straight edge 89 penetrates the substrate 83 as shown in FIG. 10B. The vertical distance $V_1$ of the embossing die 80B exceeds the maximum penetration depth $D_1$ in the substrate 83 that the embossing die 80B will penetrate. In addition, the vertical distance $V_2$ of the sloping edge 81 also exceeds the maximum penetration depth $D_1$ in the substrate 83 that the embossing die 80B will penetrate.

The sloping edge 81 and straight edge 89 can be created using techniques such as diamond machining or other precision machining. Alternatively, the sloping edge 81 and straight edge 89 can be created using techniques such as edge filing, sanding, buffing, or bending of a die plate. Alternatively, the sloping edge 81 and straight edge 89 can be created using techniques such as EDM, patterned chemical etching, patterned sand-blasting, patterned bead-blasting, hammering, and forging.

Figure 10C:
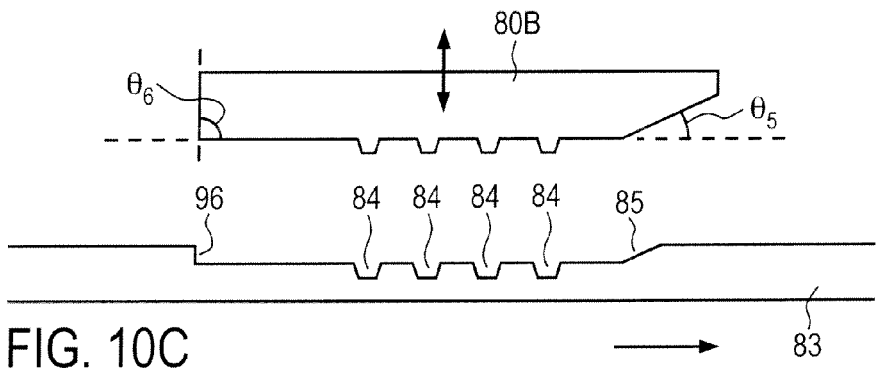
Figure 10D:
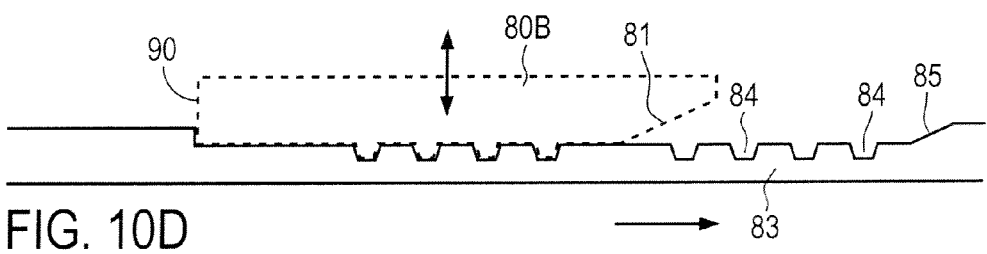
Figure 10E:
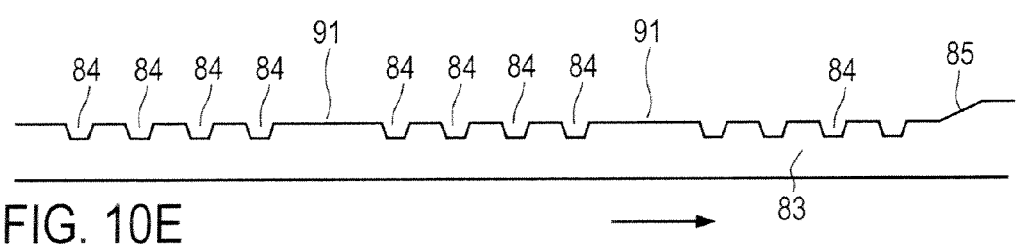

After the embossing die 80B is pressed into the substrate 83 (through a vertical motion) as illustrated in FIG. 10B, the embossing die 80B is removed from the substrate 83 and the substrate 83 may advance (FIG. 10C) so that a new section of the substrate 83 can be treated as illustrated in FIG. 10D. The substrate 83 may be supported on a platform in order for the die 80B to press into a stationary substrate 83 to create the recessed regions. Recessed regions 84 are created into the substrate 83 as illustrated in FIG. 10C. Additionally, a first indentation 85 is created on the side of the substrate that meets the sloping edge 81 and a second indentation 96 is created on the side of the substrate that meets the straight edge 89. There may be some small ridges (not shown) that may be formed at the indentation 96 that may be caused by the straight edge 90. The indentation 96 has an angle of about 90 degrees, similar to the angle $\theta_6$. The first indentation 85 has an angle of about 10-15 degrees with respect to the top surface of the substrate 83. In FIG. 10D, the embossing die 80B is embossing (or treating) another section or frame of the substrate 83. In one embodiment, the substrate 83 and the embossing die 80B are aligned over each other such that a flattened region 91 will be formed between the previous frame and the subsequent frame of the substrate 83 as shown in FIG. 10E. In a subsequent frame, the embossing die 80B is aligned over the substrate 83 such that the sloping edge 81 overlays with the indention 96 from a previous frame. As the die 80B is pressed into the substrate 83, the sloping edge 81 flattens out the indention 96 from the previous frame. As can be seen in FIGS. 10C-10D, a flattened region 91 is formed as a result of the sloping edge 81 being aligned over a previously formed indentation 96. As shown in FIG. 10E, after several frames of substrate 83 are embossed with the recessed regions 84, a flattened region 91 is formed between each two frames of the substrate.

Figure 10F:
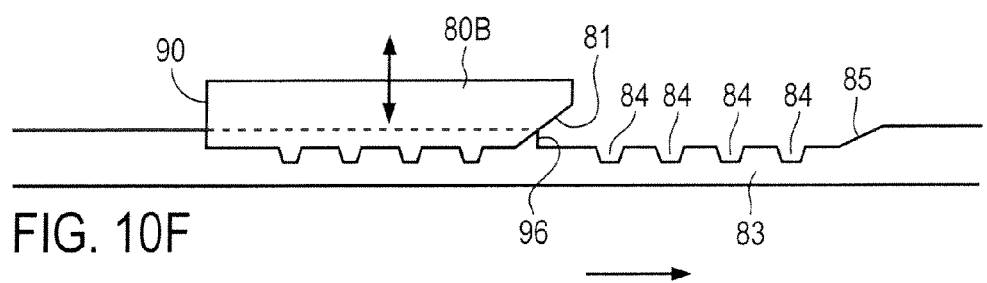
Figure 10G:
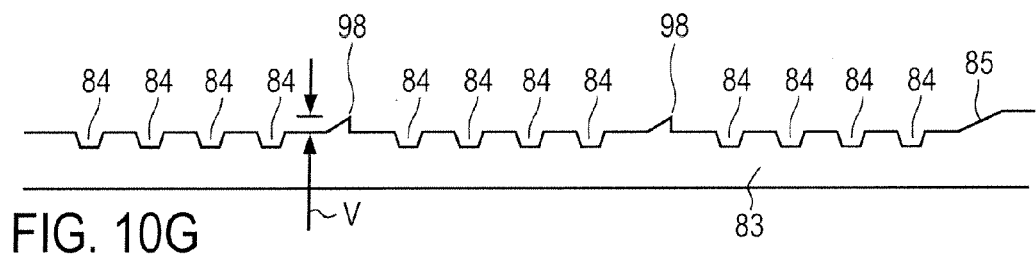

In another embodiment, the die 80B is aligned over a subsequent frame of the substrate 83 such that the sloping edge 81 causes a sloped region 98 to be formed between frames of the substrate 83. As illustrated in FIGS. 10F-10G, in the present embodiment, in a subsequent frame, the embossing die 80B is aligned such that the sloping edge 81 overlays with a portion or align at a top portion of the indention 96 from a previous frame. As the die 80B presses into the substrate 83, the sloping edge 81 causes a sloped region 98 to be formed. In one embodiment, the sloped region 98 has a maximum vertical distance less than 100 μm. The configuration of the sloped region 98 is consistent and uniform through the entire substrate 30.

Using the embossing die 80B, a flattened region 91 or a sloped region 98 can be controllably formed between frames of substrate. The die 80B is configured so that the region 91 or the sloped region 98 do not negatively impact or disturb the flow of FSA or subsequent processing to the substrate 83.

Figure 11A:
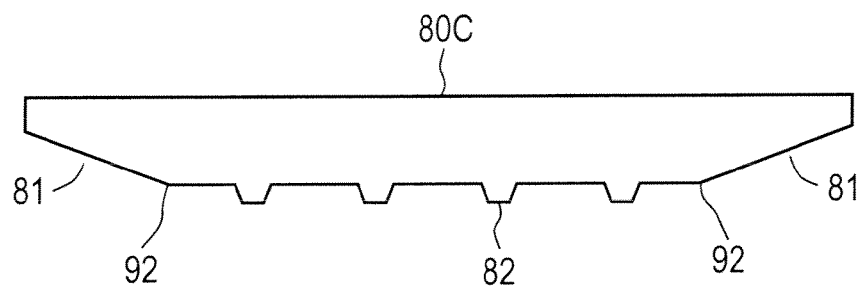
FIGS. 11A-11C illustrate more exemplary embodiments of embossing dies with gradually sloping edges that can be used to make recessed regions in a substrate in accordance to embodiments of the present invention.
Figure 11B:
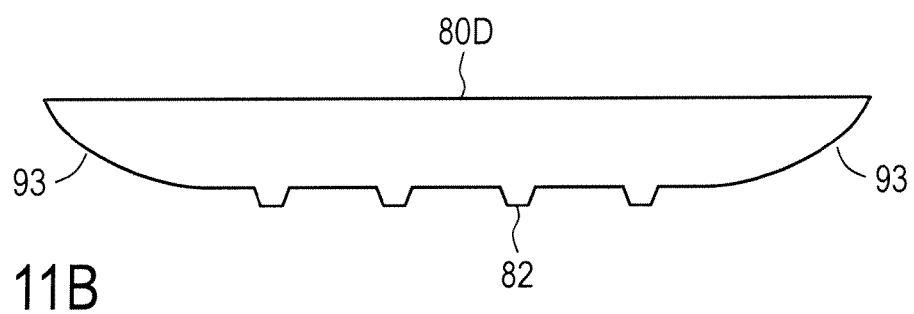
Figure 11C:
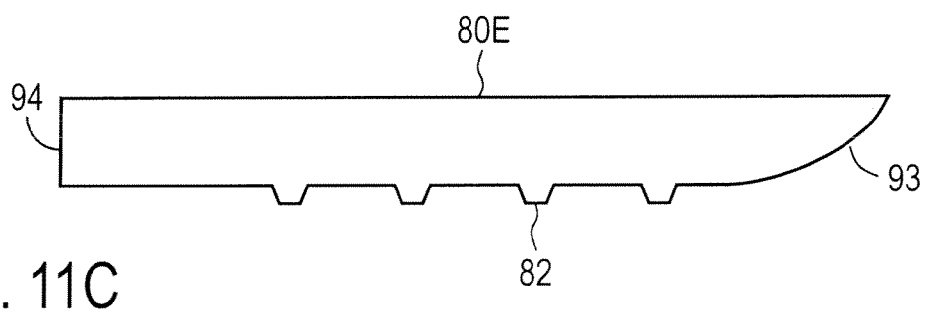

FIGS. 11A-11C illustrate various embodiments of embossing dies 80C, 80D, and 80E, respectively. These dies are similar to the dies 80A and 80B except in the variation of contours and shapes of the edges of the dies. The embossing dies 80C has rounded and gradually sloping edges 81 on both of the left side edge and the right side edge of the die. Each of the edges 81 ends with a round contour 92. The die 80C also includes features 82 used to form the recessed regions as previously discussed in previous embodiments. The die 80C functions similarly to the previous embossing dies and can be positioned over the substrate to emboss several frames of substrate such that regions between the frames do not cause a negative impact in subsequent processes such as lamination processes or FSA processes as previously discussed. Regions between frames are regions that separate or define one frame from another. The die 80C can be aligned over the substrate similarly to previous discussed to have the sloping edge cancels out a previously formed indentation (similar to FIGS. 10A-10E and 9A-9E). The embossing die 80D is similar to the embossing die 80C except that the embossing die 80D includes rounded contour edges 93. The embossing die 80E is similar to the embossing die 80B (FIG. 10A) except that the embossing die 80E includes a rounded contour edge 93 and a straight edge 94.

The exemplary embossing dies of the present invention can be used to create recessed regions in a substrate where one frame of substrate is separated from another frame of substrate by a junction or a region. The junction or region may be a gradual ramp of a predetermined shape such as a plateau with gradually sloping sides transitioning out of one embossing die into a subsequent embossing die. Alternatively, the sloping regions may overlap resulting in a flattened cross-section or region. There may be a minimal indentation (but controllable) in the flattened cross-section where the two sloping edges of the die meet to cancel out one another. The embossing dies may be configured to have different type of edges on different sides of the dies as previously discussed. In a step-and-repeat process, from one embossing step to the next embossing step, the alignment of the embossing die over the substrate can be arranged so that the embossing die can create a predetermined and controlled region or junction between one frame of the substrate to the next as previously illustrated.

The substrates of the embodiments of the present invention can be a sheet substrate or a web substrate as previously mentioned. The substrates may be comprised of polyether sulfone (PES), polysulfone, polyether imide, polyethylene terephthalate, polycarbonate, polybutylene terephthalate, polyphenylene sulfide (PPS), polypropylene, polyester, aramid, polyamide-imide (PAI), polyimide, nylon material (e.g. polyiamide), aromatic polyimides, polyetherimide, polyvinyl chloride, acrylonitrile butadiene styrene (ABS), or metallic materials. Additionally, the substrates when in a web process can be a flexible sheet with very high aspect ratios such as 25:1 or more (length:width). As is known, a web material involves a roll process. For example, a roll of paper towels when unrolled is said to be in web form and it is fabricated in a process referred to as a web process. When a web is coiled, it is in roll form.

Figure 12:
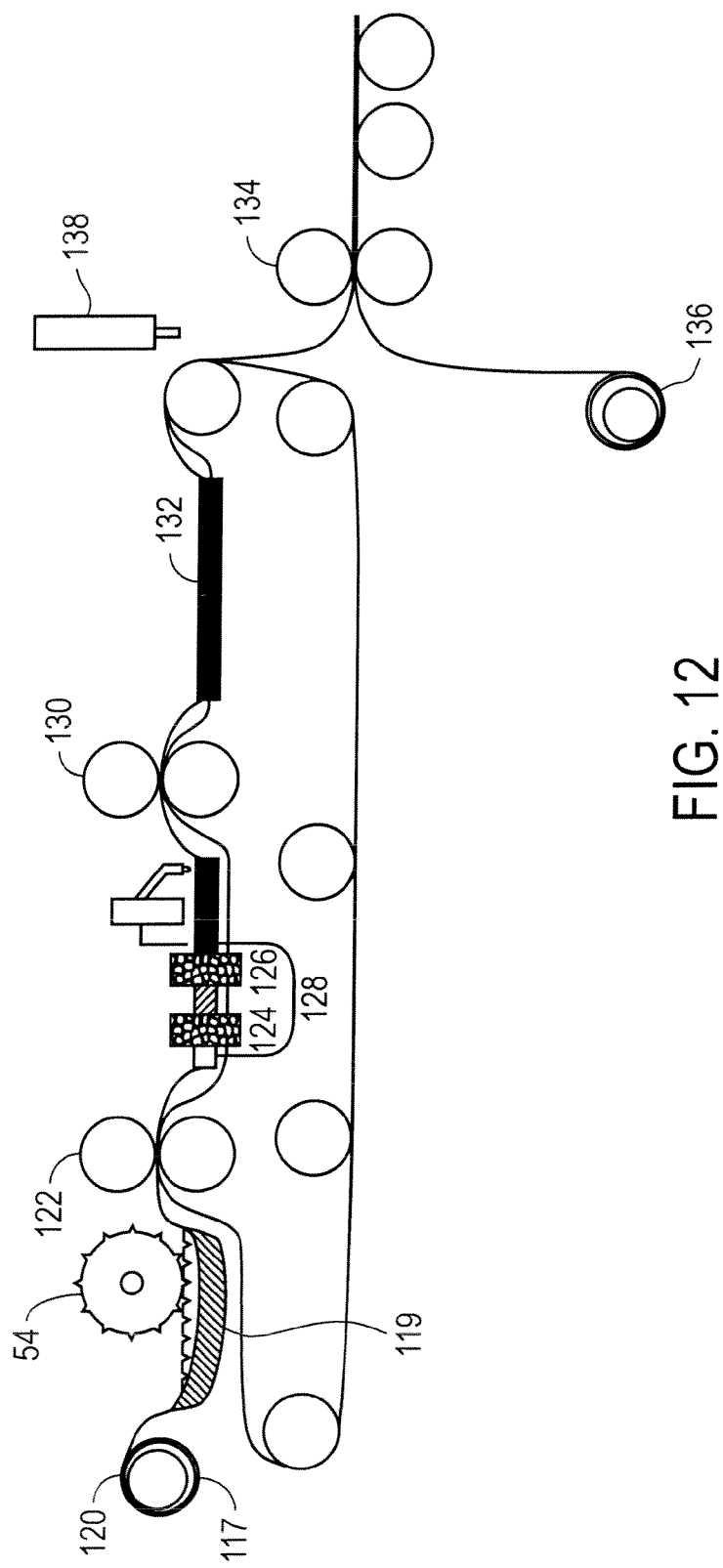
FIGS. 12-13 illustrate exemplary embodiments of various overall processes of making an electronic assembly with functional block in accordance to embodiments of the present invention.

FIG. 12 shows an overall process of fabricating an electronic assembly in according to embodiments of the present invention. Although that discussion below illustrates processes that may be continuous, other separate or sub-processes can also be used. For instance, a process that is continuous as shown in FIG. 12 can be separated into separate or sub-processes. The process in FIG. 12 can take place on one machine or on several machines.

FIG. 12 illustrates a web process where a web substrate is used for forming a plurality of electronic assemblies such as the assembly 200 or 400 previously described. A roll of substrate 120 is provided. The substrate 120 is flexible. The substrate 120 may be sprocket-hole-punched to assist in web handling. The substrate 120 is advanced from a station or roller 117 to a station 119 that forms a plurality of recessed regions as previously described. The recessed regions can be formed by machining, etching, casting, embossing, extruding, stamping, or molding and in one embodiment, one frame at a time. In one embodiment, a roller 54 including a die or template configured similarly to the embossing dies 80A-80E for the formation of the recessed regions. The roller 54 can include a plurality of dies and each die is configured to a plurality of recessed regions into a frame or a section of the substrate. The substrate 120 is then advanced through a set of support members 122 as the recessed regions are created into the substrate 120. A first slurry 124 containing a plurality of functional blocks is dispensed onto the substrate 120. A second slurry 126 containing a plurality of functional blocks may also be used to dispense onto the substrate material. Excess slurry is collected in container 128 and is recycled. The functional blocks fall into the recessed regions in the substrate 120. The substrate 120 is advanced to another set of support members 130. An inspection station (not shown) may be provided to check for empty recessed regions or for improperly filled recessed regions. There may also be clearing device to remove excess functional blocks or blocks not completely seated or deposited into the recessed regions of the substrate 120. A vibration device (not shown) may be coupled to the substrate 120 and/or to the slurry-dispensing device to facilitate the distribution and/or of the functional blocks. An example of a dispensing device that can work with vibrational assistance to dispense the functional blocks is described in U.S. patent application Ser. No. 10/086,491, entitled "Method and Apparatus For Moving Blocks" filed on Feb. 28, 2002, which is hereby incorporated by reference in its entirety. In one embodiment, the functional blocks are deposited onto the substrate 120 using methods described in U.S. patent application Ser. No. 10/086,491.

Continuing with FIG. 12, and generally shown at 132, a planarization (or dielectric) layer is then deposited or laminated or otherwise formed onto the substrate material. Vias are formed in the dielectric film. The dielectric layer can be applied using a variety of methods. Most commonly, a solid dielectric film is used, which can be applied with a hot roll laminator. Alternatively, a liquid dielectric could be applied by spin coating in sheet form using any variety of a printing methods, such as screen printing, or wet coating (e.g., by comma coating or other types of roll-to-roll liquid coaters). A liquid dielectric could either be dried or cured to form a solid dielectric layer. Curing could be thermally-activated, moisture-activated, microwave-activated, or UV light-activated. The dielectric layer can be cured or dried in-line as the layer is being formed. In one embodiment, the dielectric film is formed by direct write techniques. In one embodiment, the deposition of the functional blocks by FSA and the formation of the dielectric film are done on the same machine. Alternatively, the dielectric layer could be selectively applied in only specific locations, e.g., on the substrate areas with the functional blocks and/or over certain area of the functional blocks. In the embodiment where the dielectric layer is selectively deposited, the dielectric layer may assist in adhering the functional blocks in the recesses, and it may not be necessary to form vias.

In one embodiment, to form the vias that can expose the contact pads on the functional blocks, the substrate with the functional blocks deposited therein is inspected by an optical scanner (not shown) prior to via formation to determine the location of the contact pads on the functional blocks that need vias over them. Preferably, this inspection is done in-line with the via formation process, the image analysis is done automatically by a computerized vision system (not shown), and the results are sent directly to the via formation apparatus to select which vias to form. As a result, vias are only formed in the dielectric above the contact pads of the functional blocks.

The via opening(s) in the dielectric layer can be opened either before or after the dielectric film is placed on the functional blocks-filled substrate. The openings could be punched prior to dielectric layer application to the filled web substrate, or could be created by etching, photolithography, or by laser via drilling after the dielectric film is deposited over the substrate. Laser drilling can be used to form the vias, which could be accomplished with either a UV, visible, or IR laser. In one embodiment, a UV-laser is used to form the via openings in the dielectric layer. Laser via drilling can be accomplished with either a long pulse of energy, or a series of short pulses. In the case of a series of short pulses, the position of the laser can be adjusted so that one or more pulses occur in different positions within each via. A via with a wider, non-circular opening can be created by laser drilling partially through the dielectric film. The vias could also be self-forming in liquid systems that, after application to the functional block-filled web substrate, selectively de-wet off of the contact pads on the functional blocks.

In one embodiment, the substrate 120 is held flat on a chuck, scanned, and then drilled to form a group of vias prior to indexing forward so that another section of the substrate 120 can be treated. The scanning (e.g., optical scanning) and the via drilling may also occur on a moving web when the substrate 120 is moving or moving continuously.

Conductive interconnects are then formed on the dielectric film. The conductive interconnects also fill the vias to allow electrical interconnection to the functional blocks. In one embodiment, the vias are filled with a conductive material to form via conductors. A pad conductor is then formed on the dielectric film to interconnect to each via conductor. Each pad conductor and via conductor can form a conductive interconnect and/or be made of the same materials and in one process in many embodiments. The via conductors and the pad conductors can be formed on a continuously moving web of the substrate 120. The planarization and the conductive interconnect formation is generally shown at 132 in FIG. 12.

In one embodiment, residues in the vias are removed prior to filling the vias. The cleaning step can be accomplished by treatment with a detergent cleaning system, a water rinse system, an oxygen plasma system, a vacuum plasma system, an atmospheric plasma system, brush scrubbing system, or a sand blasting or solid carbon dioxide system. The via can be filled with the conductive material using sputtering or evaporation across the entire substrate, followed by lithographic patterning of a mask and subsequent etching, to leave metal only around and in the via. The conductive material in the vias can be formed by any of a variety of conductive composite printing methods, including screen printing or gravure printing. In some embodiments, the conductive material in the vias is formed by a printing method. The conductive material is typically thermally-cured or UV-cured, or cured by air-drying. In other embodiments, the conductive materials in the vias are formed by a direct-write or adaptive-wiring process. In the case of direct-write or adaptive wiring the positioning of each individual conductive material in each via can be controlled by a machine vision analogous to the system that is used to locate the position on the dielectric layer to form the vias openings.

Similar methods for forming the conductive material in the vias can be used to form the conductive interconnects on the dielectric film (also referred to as pad conductors) that couple to the via conductors. In some embodiments, the same conductive material is used to fill the via as well as forming the interconnects on the dielectric layer as previously described. In one embodiment, the interconnects are formed by metal sputtering or evaporation across the entire substrate 120, followed by lithographic patterning of a mask and subsequent etching, to leave metal only in the preferred pad conductor shape and in contact with the conductor in the vias. The via conductors and the pad conductors can be formed in one step as forming one continuous conductor.

A station 138 may be provided to inspect and/or test the functionality of the assemblies. The assemblies are tested for functionality such that known-bad assemblies can be marked, so that they can be actively avoided in future process steps. Known-good assemblies can be marked, so that they can be actively selected in future process steps. The mark can be an ink mark, ink jet marking, stamping, or a laser burn mark, or any other mark that is detectable by either a human eye, a sensor, or both. In one embodiment, the marking is a laser marking and is applied to the particular pad conductors so as to leave a black mark on the pad conductors. In one embodiment, the tests are done by coupling the electromagnetic energy from the tester to the assemblies. The coupling can be resistive, inductive, or capacitive, or a combination thereof, using contact methods (e.g., direct electrical contact), non-contact methods, or a combination thereof. Even in a densely-packed set of straps, individual assemblies can be tested without undue interference from neighboring devices. In one embodiment, individual assemblies are tested based on a predefined set of criteria or parameters, for instance, one assembly out of every 10 assemblies formed on a web is tested. Other criteria or parameters are of course possible. After the testing, the substrate material is further advanced to another set of support members 134 for subsequent processing or lamination processes. In one embodiment, an additional conductive trace is formed on the substrate material to interconnect to the conductive interconnect. The conductive trace may be an antenna trace or other conductive element for an external electrical element. The conductive trace may be formed by a convenient method such as printing, laminating, deposition, etc. A roll of material 136 is shown to laminate to the substrate 120. The material from the roll 136 can be a cover a jacket or other suitable material for subsequent processing or for completing the assemblies. In one embodiment, the roll 136 is a device substrate having formed thereon a conductor pattern. The substrate 120 having the functional blocks deposited therein and other elements formed therein/thereon is attached to the substrate from the roll 136 such that the conductive interconnects are coupled to the conductor pattern. In one embodiment, the substrate assemblies after processed as shown in FIG. 12 are singulated or cut to form individual assemblies such as assemblies 200 or 400.

Figure 13:
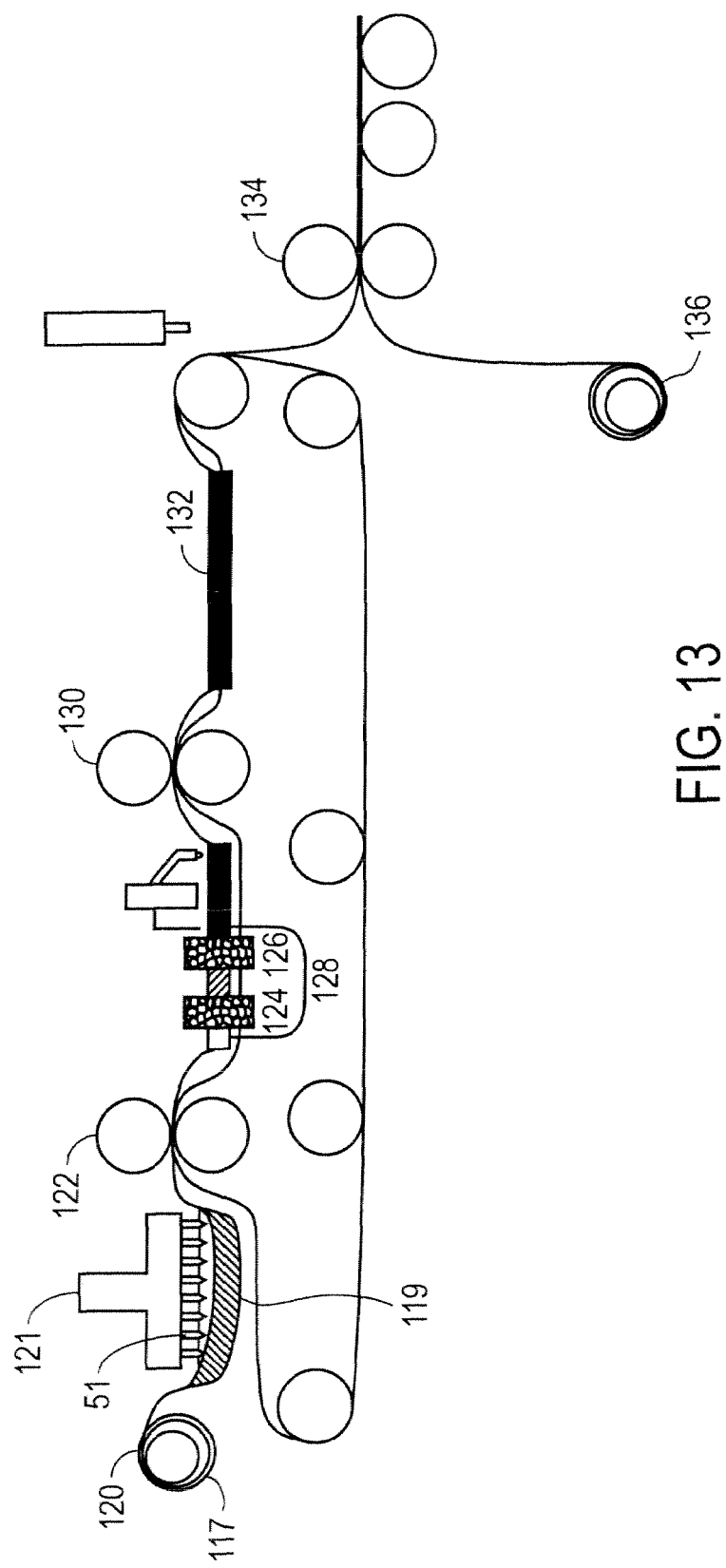

FIG. 13 illustrates another overall process of fabricating an electronic assembly in according to embodiments of the present invention. This process is similar to the one described in FIG. 12 except that the recessed regions on the substrate material are formed using a step-and-repeat process.

Similar to FIG. 12, in FIG. 13, a substrate roll 120 is provided. The substrate 120 is flexible. The substrate 120 may be sprocket-hole-punched to assist in web handling. The substrate 120 is advanced from a station 117 to a station 119 that forms a plurality of recessed regions as previously described. In one embodiment, a vertical hot press 121 is provided with an embossing die similar to of the dies 80A-80E previously described for the formation of the recessed regions. The substrate 120 is advanced through a set of support members 122 as the recessed regions are created into the substrate material. Each time a frame of substrate 120 is aligned under the embossing die, the vertical hot press 121 moves down and presses into the substrate 120 to create the recessed regions. A first slurry 124 containing a plurality of functional blocks is dispensed onto the substrate 120. A second slurry 126 containing a plurality of functional blocks may also be used to dispense onto the substrate 120. Excess slurry is collected in a container 128 and is recycled. The functional blocks fall into the recessed regions in the substrate 120. The substrate 120 is advanced to another set of support members 130. An inspection station (not shown) may be provided to check for empty recessed regions or for improperly filled recessed regions. There may also be a clearing device (not shown) to remove excess functional blocks or blocks not completely seated or deposited into the recessed regions of the substrate 120. A vibration device (not shown) may be coupled to the substrate 120 and/or to the slurry dispensing device to facilitate the distribution and/or deposition of the functional blocks. An example of a dispensing device that can work with vibrational assistance to dispense the functional blocks is described in U.S. patent application Ser. No. 10/086,491, previously cited.

Continuing with FIG. 13, and generally shown at 132 a planarization (or dielectric) layer is then deposited or laminated onto the substrate 120 similar to previously discussed. Vias are formed in the dielectric film. Conductive interconnects are then formed on the dielectric film. The conductive interconnects also fill the vias to allow electrical interconnection to the functional blocks. In one embodiment, the vias are filled with a conductive material referred to as a via conductor. A pad conductor is then formed on the dielectric film to interconnect to the via conductor. The pad conductor and the via conductor can form the conductive interconnect in many embodiments. The planarization and the conductive interconnect formation is generally shown at 132 in FIG. 13. A station 138 may be provided to inspect and/or test the functionality of the assemblies as previously described. After the testing, the substrate 120 is further advanced to another set of support members 134 for subsequent processing or lamination processed. In one embodiment, a conductive trace is formed on the substrate 120 to interconnect to the conductive interconnect. The conductive trace may be an antenna trace or other conductive element. The conductive trace may be formed by a convenient method such as printing, laminating, deposition, direct writing, etc. A roll of material 136 is shown to laminate to the substrate 120. The material can be a cover a jacket or other suitable material to complete the assemblies. In one embodiment, the roll 136 is a device substrate having formed thereon a conductor pattern. The substrate 120 having the functional blocks deposited therein and other elements formed therein/thereon is attached to the substrate from the roll 136 such that the conductive interconnects are coupled to the conductor pattern. In one embodiment, the substrate assemblies after processed as shown in FIG. 13 are singulated or cut to form individual assemblies such as assemblies 200 or 400.

In many applications, different substrates made of or comprised of different materials may be spliced or joined together prior to the assembling of functional components or depositions or laminations of various layers onto or into the different substrate. Splicing or joining of different substrates may be accomplished by tape splicing, ultrasonic welding, solvent welding, or thermal bonding. In many applications, different substrates may include substrates having different recessed region configurations or sizes. Different substrates may also include substrates being previously treated differently. These different substrates can be spliced together prior to the assembling of various functional components or depositions or laminations of various layers onto or into the different substrates. Splicing the differently treated or different substrates together may save assembly cost and time for device fabrication. In one embodiment, a roll of substrate or a long sheet of substrate is formed from these different substrates that have been spliced together. The roll or long sheet of substrate is then put through subsequent processing that can performed in a web process. It is to be noted that the substrates that are joined together need not be different from one another and may in fact be exact, similar, exactly treated, or similarly treated to one another.

Figure 14:
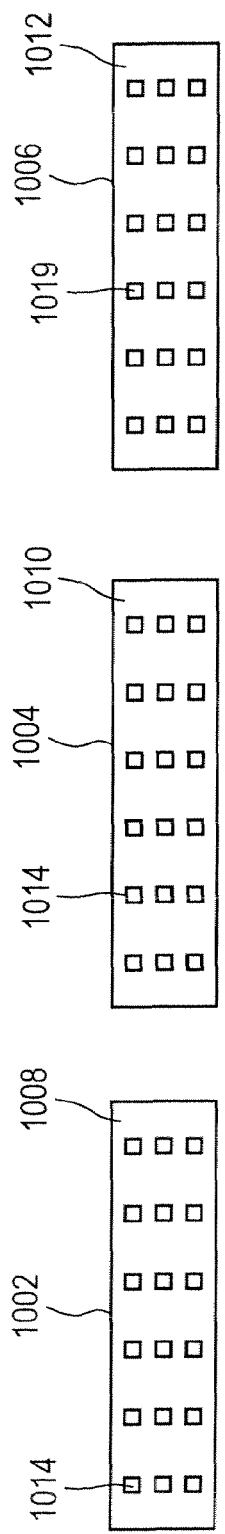
FIGS. 14-15 illustrate an exemplary embodiments of forming a roll or a long sheet of substrate comprising of various different types of substrates or differently treated substrates joined together.
Figure 15:
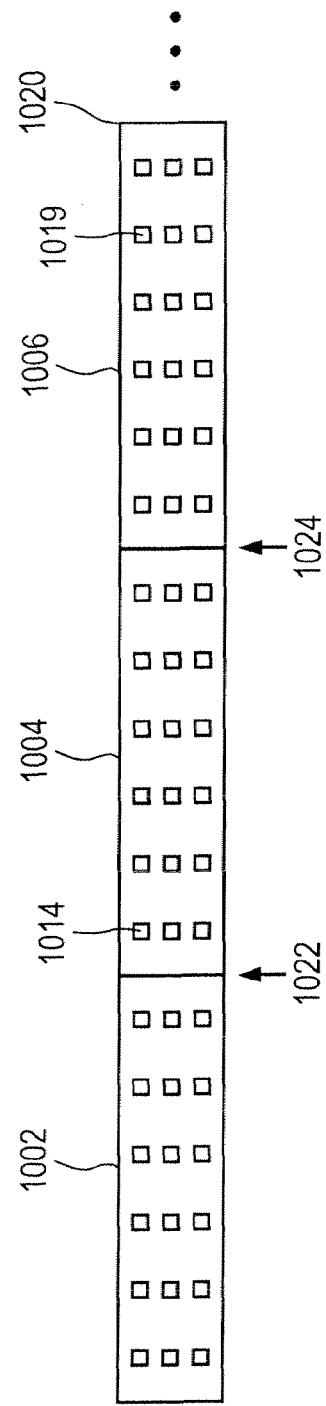

FIGS. 14-15 illustrate an exemplary embodiment where various different substrates and/or various individual similar or same substrates are welded, spliced or joined together. For instance, a substrate 1002 and a substrate 1004 are made of different materials or include different layers of materials. Both of the substrate 1002 and 1004 may include similarly configured recessed regions 1014. In another instance, the substrate 1004 includes differently configured recessed regions as compared to another substrate 1006, which is provided with recessed regions 1019. In one embodiment, to form the recessed regions in the substrate 1002, one of the embossing dies 80A-80E with one or more gradually sloping edges is used. The substrate 1002 may include several individually embossed frames formed using the embodiments above. In one embodiment, the frames in the substrate 1002 are embossed according to the embodiments of FIGS. 8-11. Similarly, the recessed regions in the substrates 1004 and 1006 may also be formed using one of the embodiments above.

In FIG. 15, the substrates 1002, 1004, and 1006 are welded, joined, or spliced together to form a substrate 1020. There may be a step-change between each two substrates. For instance, a step-change 1022 is formed between the substrates 1002 and 1004 and a step-change 1024 is formed between the substrate 1004 and 1006. The step-changes 1022 and 1024 are uniform and consistent in the change of direction. In such embodiments, the FSA or other subsequent processes are not interrupted by inconsistent, uncontrollable, or unpredictable step-changes. These regions also have controlled gradual ramps that do not interfere with subsequent FSA processes or lamination processes. Additionally, between frames of substrate that are formed by the embossing dies with gradually sloping edges (e.g., dies 80A-80E), there are regions that have controlled slopes, plateaus, or indentations (not shown). These regions also do not interrupt or interfere with subsequent FAS processes or lamination processes as previously discussed. Additionally, the same FSA processes or other desired lamination processes can be used for differently treated or different substrate, which allows for optimization of time, processing line, processing set up, and of more expensive processing.

Figure 16:
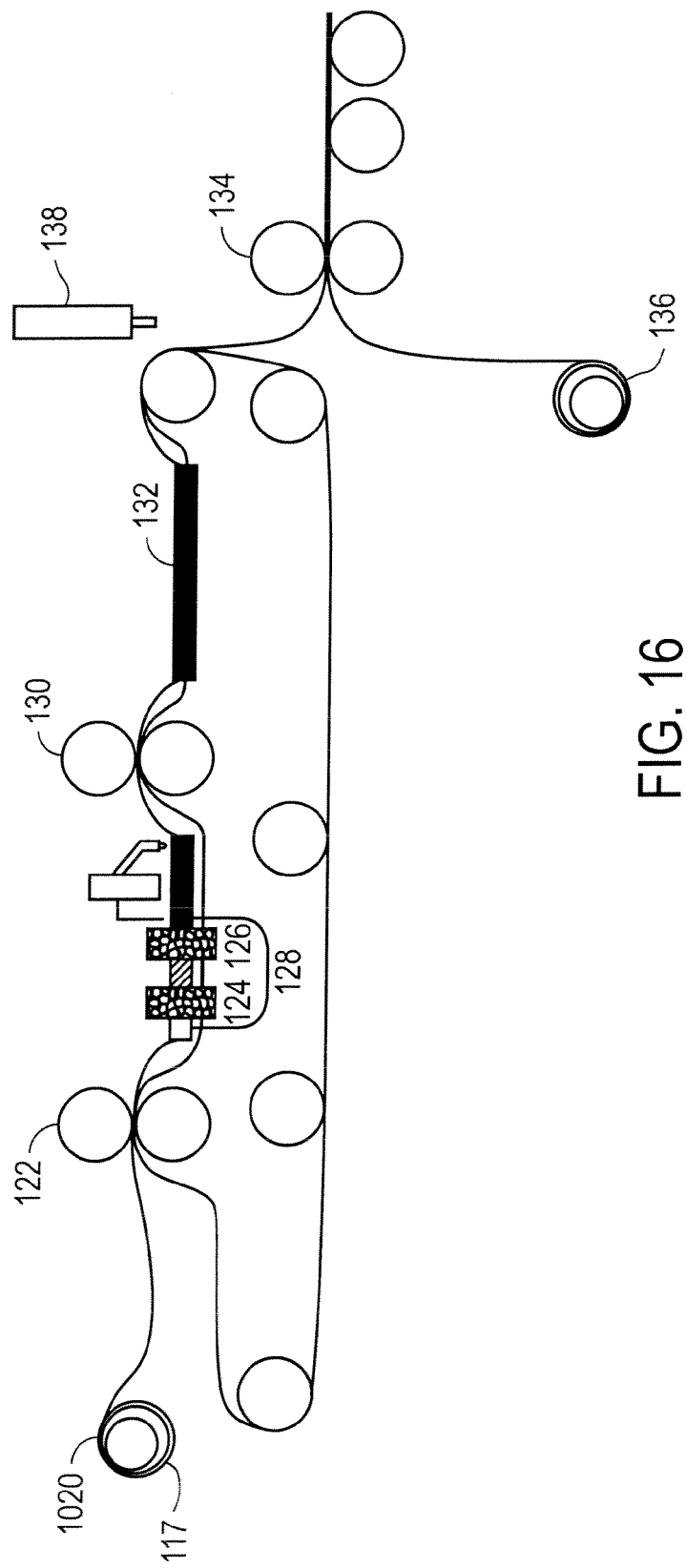
FIGS. 16-17, 18A-18B and 19 illustrate exemplary methods of making an electronic assembly with functional block in accordance to embodiments of the present invention.

In one embodiment, after the substrate 1020 is formed, the substrate 1020 is a continuous roll or sheet of different substrates or differently treated substrate joined together. Each of the different substrates may have similarly of differently configured recessed regions compared to each other. The substrate 1020 may be rolled up into a roll form and placed on a web line processing similar to those described in FIGS. 12-13 to deposit the same types or different types of functional blocks and form other elements on the substrate 1020. As can be seen in FIG. 16, the substrate 1020 is advanced from a station or a roller 117 to and through a set of support members 122. A first slurry 124 containing a first plurality of functional blocks is dispensed onto the substrate material. A second slurry 126 containing a second plurality of functional blocks may also be used to dispense onto the substrate material. The first plurality of functional blocks may be different from the second plurality of functional blocks. For example, the blocks from first plurality of functional blocks have bigger size than the blocks from the second plurality of functional blocks. In another example, the first plurality of functional blocks have a different shape compared to the second plurality of functional blocks. Excess slurry is collected in a container 128 and is recycled. Separate container 128 may be provided for each of the first and second plurality of functional blocks. The functional blocks fall into the recessed regions in the substrate 1020. The substrate 1020 is advanced to another set of support members 130. An inspection station (not shown) may be provided to check for empty recessed regions or for improperly filled recessed regions. There may also be clearing device to remove excess functional blocks or block not completely seated or deposited into the recessed regions off the substrate 1020. A vibration device (not shown) may be coupled to the substrate 1020 and/or to the slurry-dispensing device to facilitate the distribution and/or deposition of the functional blocks. An example of a dispensing device that can work with vibrational assistance to dispense the functional blocks is described in U.S. patent application Ser. No. 10/086,491 previously cited.

A planarization (or dielectric) layer is then deposited or laminated onto the substrate 1020. Vias are formed in the dielectric film. Conductive interconnects are then formed on the dielectric film. The conductive interconnects also fill the vias to allow electrical interconnection to the functional blocks. In one embodiment, the vias are filled with a conductive material referred to as a via conductor. A pad conductor is then formed on the dielectric film to interconnect to the via conductor. The pad conductor and the via conductor can form the conductive interconnects in many embodiments. The planarization and the conductive interconnect formation is generally shown at 132 in FIG. 16. A station 138 may be provided to inspect and/or test the functionality of the assemblies as previously described. The substrate 1020 is further advanced to another set of support members 134 for subsequent processing or lamination processed. In one embodiment, a conductive trace is formed on the substrate 1020 to interconnect to the conductive interconnect. The conductive trace may be an antenna trace or other conductive element. The conductive trace may be formed by a convenient method such as printing, laminating, deposition, etc. A roll of material 136 is shown to laminate to the substrate 1020. The material can be a cover a jacket or other suitable material to complete the assemblies. In one embodiment, the roll 136 is a device substrate having formed thereon a conductor pattern. The substrate 1020 having the functional blocks deposited therein and other elements formed therein/thereon is attached to the substrate from the roll 136 such that the conductive interconnects are coupled to the conductor pattern. In one embodiment, the substrate assemblies after processed as shown in FIG. 16 are singulated or cut to form individual assemblies such as assemblies 200 or 400. A sorting station (not shown) may also be provided to sort or categorize the different assemblies that are formed on different substrates. In one embodiment, the substrate 1020 is singulated according to the different substrates that were joined together prior to the simulation of the individual assemblies.

Figure 17:
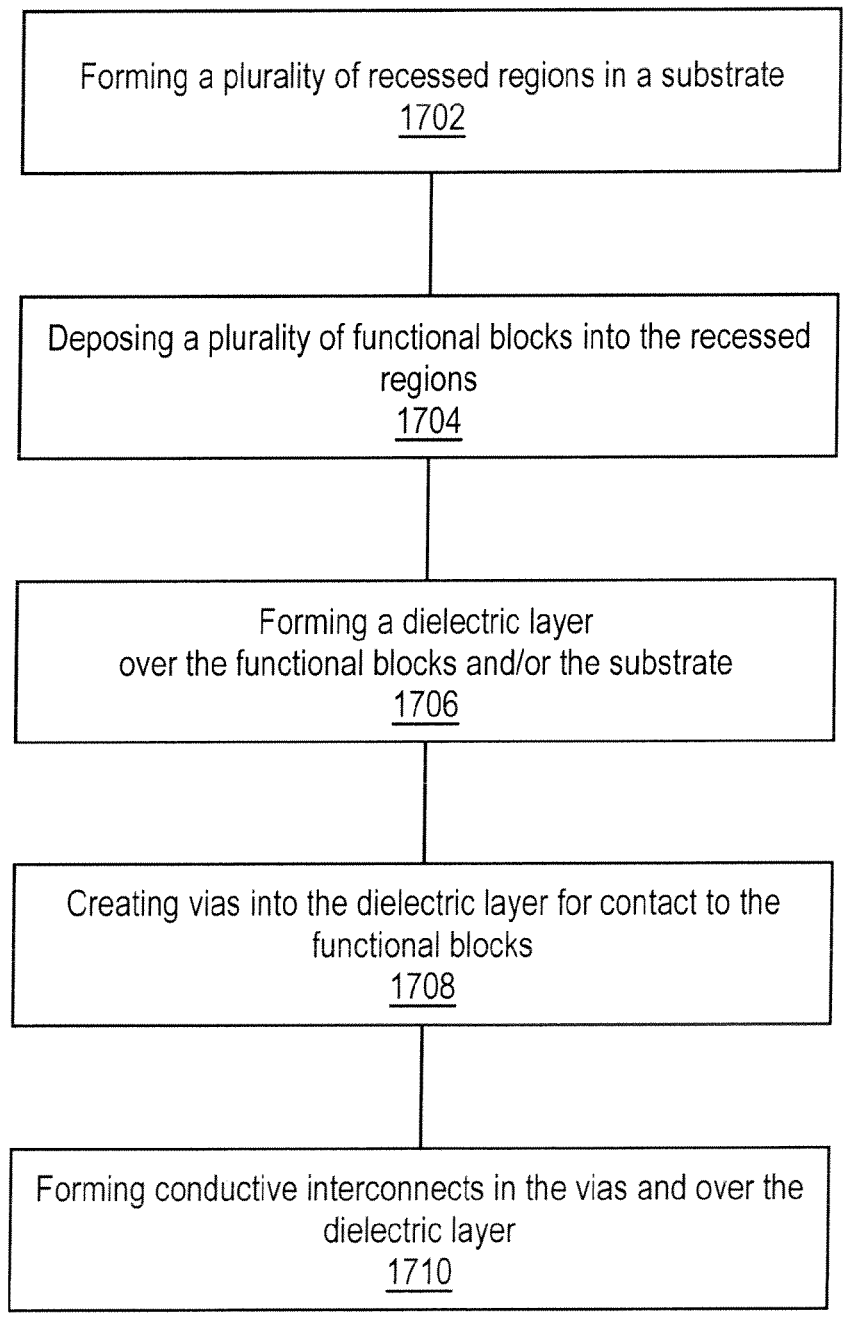

FIG. 17 illustrates an exemplary method 1700 of forming an electronic assembly in accordance to embodiments of the present invention. At box 1702, a plurality of recessed regions is formed on a substrate. At box 1704, a plurality of functional blocks is deposited into the recessed regions. Each of the functional blocks is deposited in one of the recessed regions. A substantial amount of the plurality of functional blocks is recessed below a top surface of said substrate. As mentioned above, substantial amount is defined by (1) less than 10% of the functional blocks protrudes above the top surface of the substrate, (2) less than 1% of the functional blocks protrudes above the top surface of the substrate, (3) more than 90% of the functional blocks are recessed below the top surface of the substrate, or (4) more than 99% of the functional blocks are recessed below the top surface of the substrate.

In one embodiment, each of the recessed regions has a first width-depth aspect ratio and each of the functional blocks has a second width-depth aspect ratio. The first width-depth aspect ratio substantially matches the second width-depth aspect ratio. The first width-depth aspect ratio is one of equal to or less than 10.5:1, and equal to or less than 7.5:1.

A step-and-repeat process can be used to form the recessed regions as previously described. In such process, one area of the substrate is formed with the plurality of recessed regions at a time. In one embodiment, the material web that is used for the substrate is passed under a vertical hot press wherein a mold is attached thereto to form the plurality of recessed regions. At least one area of the substrate is formed with the plurality of recessed regions each time the substrate passes the vertical hot press. In one embodiment, an embossing die having at least one gradually sloping edge (e.g., similar to the dies 80A-80E) is coupled to the vertical hot press for the formation of the recessed regions. Between each area of the substrate, a region is formed wherein the region has a flattened configuration or a gradually sloped plateau or other configurations that are controlled by the edges of the embossing dies. The region is also configured to cause minimal interference or interruption or negatively impact on processes such as FSA or laminations.

In another embodiment, a continuous process is used to form the recessed regions as previously described. In one embodiment, a material that is used to form the substrate is extruded to form the substrate and while extruding, the plurality of recessed regions is formed into the substrate. In the present embodiment, materials used to form or extrude the substrate such as polymer pellets are heated and extruded to form a melted film. A roller or a template with features provided to form the recessed regions is brought into contact with the melted film. The recessed regions are thus formed into the substrate while it is being extruded.

At box 1706, a dielectric layer is formed over the functional blocks and/or the substrate. At box 1708, vias are created into the dielectric layer to allow contact to the functional blocks or the contact pads on the functional blocks as previously described. At box 1710, conductive interconnects are formed in the vias and over the dielectric layer as previously described to form via conductors and pad conductors.

Figure 18A:
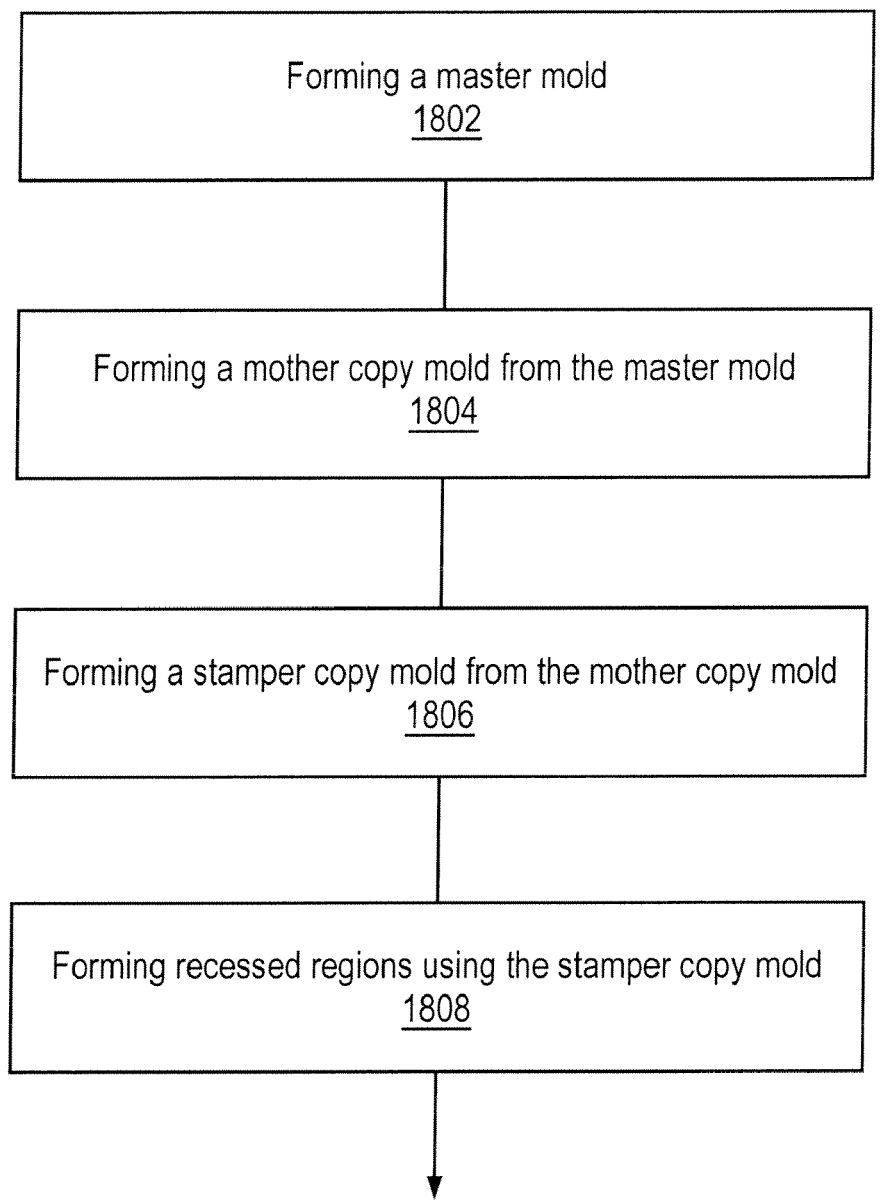
Figure 18B:
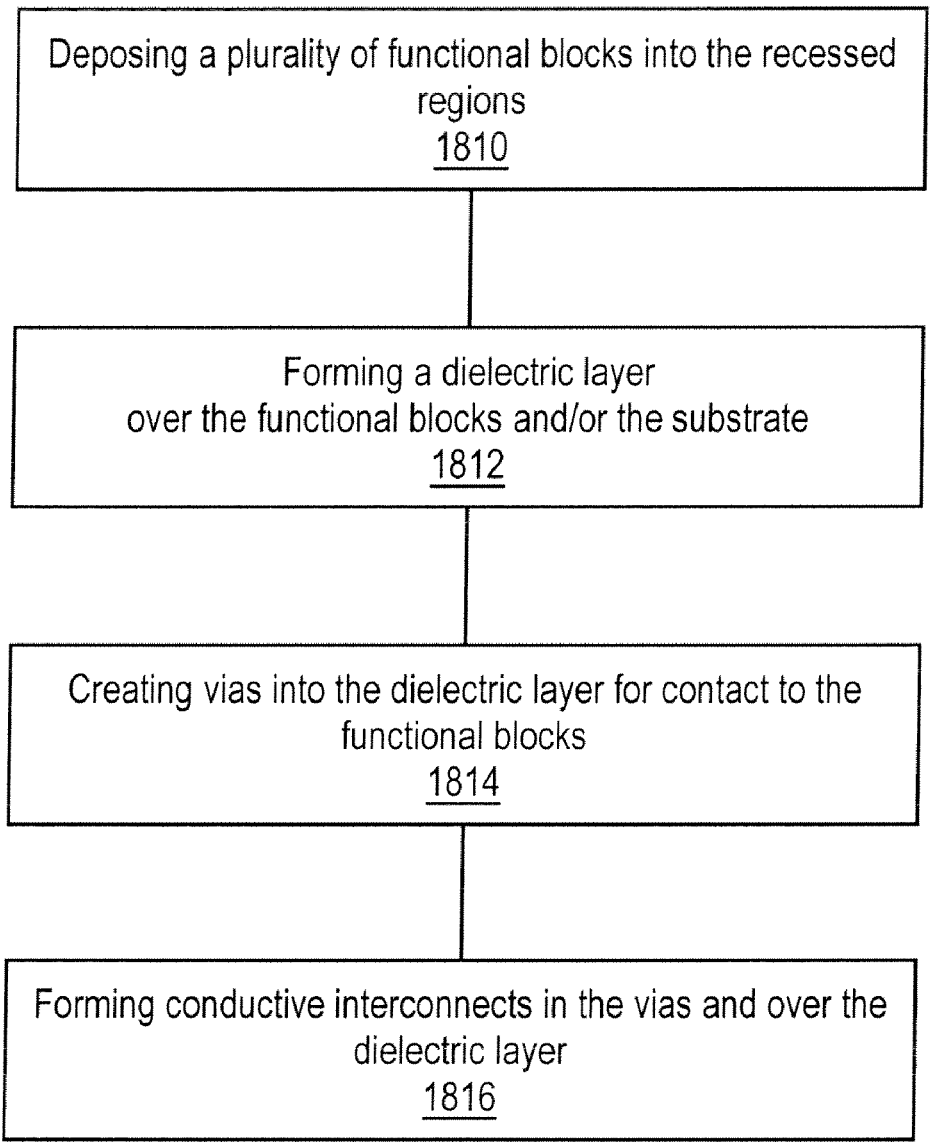

FIGS. 18A-18B illustrate an exemplary method 1800 of forming an electronic assembly in accordance to embodiments of the present invention. The method 1800 is similar to the method 1700 described above with the addition of using copies of an embossing mold to form the recessed regions. At box 1802, a master mold is formed. The master mold has a least one edge that has a gradually sloping edge similar to the embossing dies 80A-80E previously described. The master mold comprises an etched silicon wafer and/or a diamond turning machined metal plate. In the case of a female silicon water master, which has receptors rather than embossing features, a father copy mold is made first, and the mother copy mold is made from the father copy mold. At box 1804, a mother copy mold from the master mold is formed. At box 1806, a stamper copy mold from the mother copy mold is formed. At box 1808, the stamper copy mold is used to form each of the plurality of recessed regions on a substrate. Each of the master mold, the mother copy mold, the father copy mold, and the stamper copy mold comprises feature dimensions provided for each of the plurality of recessed regions. The feature dimensions for each of the plurality of recessed regions are about 0.5-1.0% larger than a desired corresponding feature of each of the plurality of recessed regions. Typically, each of the forming steps involves electroforming a nickel plate or shim, but other forming methods, such as molding or casting of metal or polymer are also available.

In another embodiment, a master mold negative is formed from the master mold. A stamper copy mold is then formed from the master mold negative. At box 1808, the stamper copy mold formed or generated form the master mold negative is used to form each of the plurality of recessed regions.

In another embodiment, one or more stamper copy molds are formed. Each of the stamper copy mold comprises at least one feature for forming one of the plurality of recessed regions. The stamper copy molds are then welded together to form a final mold having an array of the features for forming an array of the recessed regions. The features are then used to form an array of the plurality of recessed regions on the substrate. After all the stamper copy molds are welded together, the final mold is configured to have at least one edge that is a gradually sloping edge similar to the dies 80A-80E previously described.

At box 1810, a plurality of functional blocks is deposited into the recessed regions. Each of the functional blocks is deposited in one of the recessed regions. A substantial amount of the plurality of functional blocks is recessed below a top surface of said substrate. As mentioned above, substantial amount is defined by (1) less than 10% of the functional blocks protrudes above the top surface of the substrate, (2) less than 1% of the functional blocks protrudes above the top surface of the substrate, (3) more than 90% of the functional blocks are recessed below the top surface of the substrate, or (4) more than 99% of the functional blocks are recessed below the top surface of the substrate.

At box 1812, a dielectric layer is formed over the functional blocks and/or the substrate. At box 1814, vias are created into the dielectric layer to allow contact to the functional blocks or the contact pads on the functional blocks as previously described. At box 1816, conductive interconnects are formed in the vias and over the dielectric layer as previously described.

Figure 19:
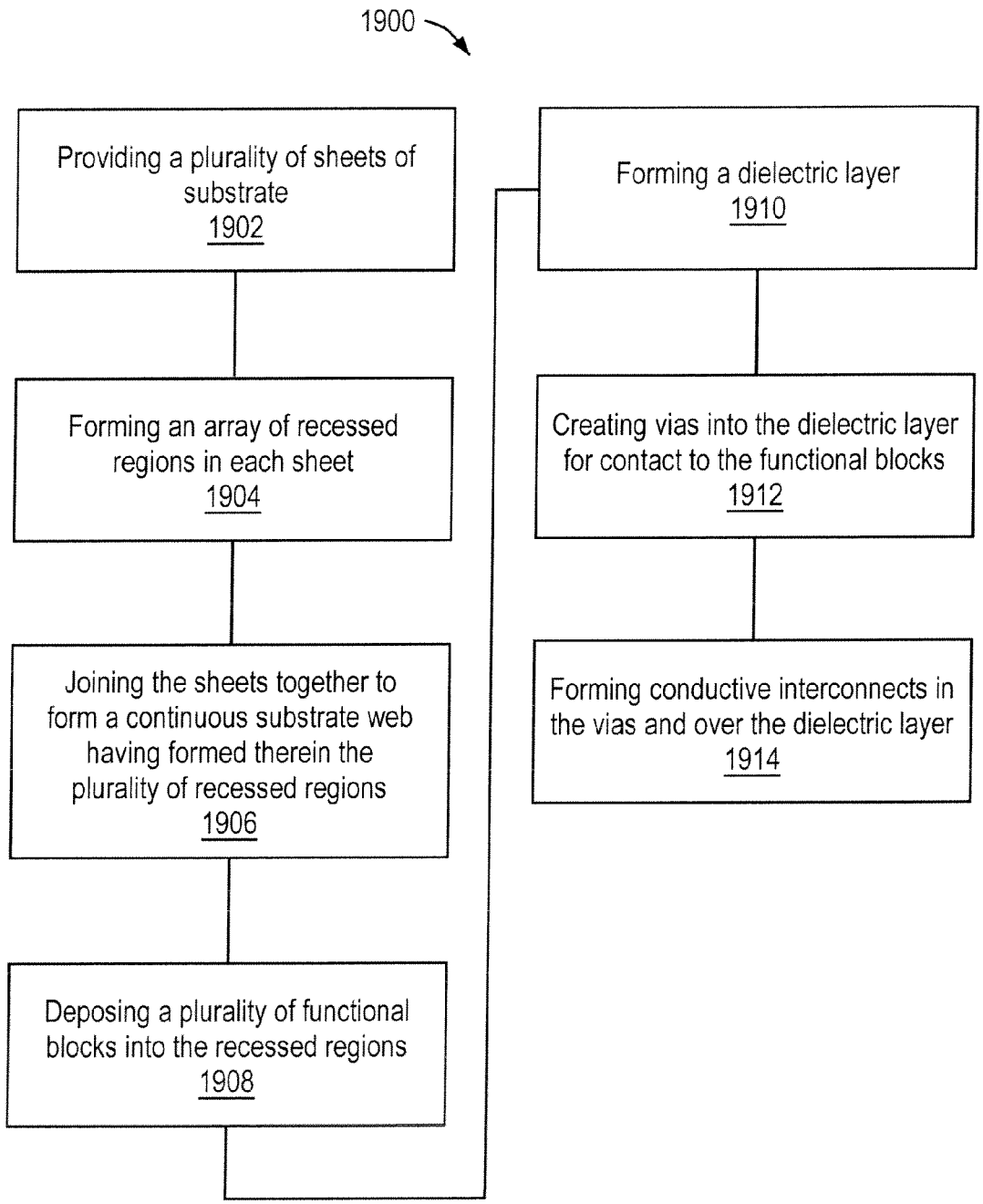

FIG. 19 illustrates another exemplary method 1900 of forming an electronic assembly in accordance to embodiments of the present invention. At box 1902, a plurality of sheets of substrates is provided. The sheets comprise of materials that are used for the substrates of a plurality of electronic assemblies. The sheets can be comprised of different, same, or similar materials, similarly or differently treated, and/or intended for same or different devices. At box 1904, an array of the recessed regions is formed on each sheet. The sheets may all have the same types of recessed regions or different types of recessed regions formed therein. At box 1906, the sheets are joined or welded together to form a continuous web of the substrate having formed therein the plurality of recessed regions.

In one embodiment, each of the recessed regions has a first width-depth aspect ratio and each of the functional blocks has a second width-depth aspect ratio. The first width-depth aspect ratio substantially matches the second width-depth aspect ratio. The first width-depth aspect ratio is one of equal to or less than 10.5:1, and optimally equal to or less than 7.5:1.

In one embodiment, a step-and-repeat process using an embossing mold is used to form the recessed regions as previously described. In one embodiment, the embossing mold is similar to one of the dies 80A-80E previously described. In the present embodiment, the mold has at least one gradually sloping edge. In the present embodiment, each sheet is formed with the plurality of recessed regions at a time. After the recessed regions are formed, the sheets are joined together.

In an alternative embodiment, the sheets are joined together prior to the formation of the recessed regions. Previous methods discussed can be used to form the recessed regions in the joined sheets.

As previously mentioned, when the sheets are joined together. Between two sheets, there may be a step-change and that one step-change is consistent in direction of change with another step-change from one sheet to the next sheet.

At box 1908, a plurality of functional blocks is deposited into the recessed regions. Each of the functional blocks is deposited in one of the recessed regions. A substantial amount of the plurality of functional blocks is recessed below a top surface of said substrate. As mentioned above, substantial amount is defined by any (1) less than 10% of the functional blocks protrudes above the top surface of the substrate, (2) less than 1% of the functional blocks protrudes above the top surface of the substrate, (3) more than 90% of the functional blocks are recessed below the top surface of the substrate, or (4) more than 99% of the functional blocks are recessed below the top surface of the substrate.

At box 1910, a dielectric layer is formed over the functional blocks and/or the substrate. At box 1912, vias are created into the dielectric layer to allow contact to the functional blocks or the contact pads on the functional blocks as previously described. At box 1914, conductive interconnects are formed in the vias and over the dielectric layer as previously described.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. An assembly comprising:
   a substrate including more than one defined frames;
   each of said defined frames comprising a plurality of recessed regions and a plurality of functional blocks, each of said functional blocks is deposited in one of said recessed regions;
   each of said defined frames is separated from another frame by a region, said region being one of a sloped region, and a plateau shaped region having a plateau top and two sloped sides, each sloped side being about 10-15 degrees to a surface of said substrate.

2. The assembly of claim 1 wherein
   said recessed regions have a first width-depth aspect ratio;
   said functional block have a second width-depth aspect ratio;

said first width-depth aspect ratio substantially matches said second width-depth aspect ratio, wherein said first width-depth aspect ratio is one of equal to or less than 10.5:1.

3. The assembly of claim 1 wherein each recessed region has a first depth and each said functional blocks has a total thickness, said first depth of each recessed region is any one of at least 1 μm greater and at most 10 μm greater than said total thickness of each functional block or at least 0 μm greater and at most 10 μm greater than said total thickness of said functional block.

4. The assembly of claim 1 wherein each recessed region has a first width and each functional block has a total width, said first width of each recessed region is any one of at least 1 μm greater and at most 10 μm greater than said total width of each functional block or at least 0 μm greater and at most 10 μm greater than said total thickness of said functional block.

5. The assembly of claim 1 wherein said region is substantially uniform from one frame to a next frame of the substrate.

6. The assembly of claim 1 wherein said region has a maximum vertical height less than 100 μm.

7. The assembly of claim 1 wherein said recessed region has a bottom side, top sides, and sidewalls, each of said a bottom side, top sides, and sidewalls being substantially flat with no protrusion.

8. The assembly of claim 7 wherein substantially flat with no protrusion is characterized by each of bottom side, top sides, and sidewalls having no protrusion greater than 5 μm.

9. The assembly of claim 1 wherein said substrate has a glass transition temperature between about 125-150° C.

10. The assembly of claim 1 wherein said substrate is characterized by having a receptor positional distortion of about 30-300 μm across a substrate area of about 200 mm when said substrate is subjected to a first thermal excursion for 30 minutes at 125° C.

11. The assembly of claim 1 wherein said substrate is characterized by having a receptor positional distortion of about 30-500 μm across a substrate area of about 200 mm when said substrate is subjected to a first thermal excursion for 30 minutes at 150° C.

12. The assembly of claim 1 wherein each of said functional blocks includes at least one contact pad formed on a top surface of said functional block, said assembly further comprising:
  a dielectric layer formed over each of said functional blocks;
  a via formed in said dielectric layer, said via exposing said contact pad, and said via having a diameter that is smaller than said contact pad.

13. The assembly of claim 12 wherein said via has a cone-like shape wherein said via has a bottom diameter and a top diameter, said bottom diameter is smaller than said top diameter, and said bottom diameter is at least 20% smaller than said contact pad.

14. The assembly of claim 12 wherein said via has a non-symmetrical cone-like shape with a flatter slope on one side of said via.

15. The assembly of claim 12 wherein a conductive interconnect fills said via and covers all of exposed area of said contact pad.

16. The assembly of claim 12 wherein said conductive interconnect has a conductor diameter that is about 2-3 times larger than said top diameter of said via.

* * * * *